US010712955B2

(12) United States Patent
Jeon et al.

(10) Patent No.: US 10,712,955 B2
(45) Date of Patent: Jul. 14, 2020

(54) NON-VOLATILE MEMORY DEVICE INCLUDING MEMORY PLANES, AND OPERATING METHOD THEREOF

(71) Applicant: Samsung Electronics Co., Ltd., Suwon-si, Gyeonggi-do (KR)

(72) Inventors: Su-chang Jeon, Seoul (KR); Sang-won Park, Seoul (KR); Dong-kyo Shim, Seoul (KR); Dong-hun Kwak, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/145,772

(22) Filed: Sep. 28, 2018

(65) Prior Publication Data

US 2019/0114099 A1    Apr. 18, 2019

(30) Foreign Application Priority Data

Oct. 12, 2017  (KR) .......................... 10-2017-0132752

(51) Int. Cl.
*G11C 16/10*  (2006.01)
*G06F 3/06*  (2006.01)
*G11C 16/30*  (2006.01)
*G11C 16/32*  (2006.01)

(52) U.S. Cl.
CPC .......... *G06F 3/0625* (2013.01); *G06F 3/0653* (2013.01); *G06F 3/0688* (2013.01); *G11C 16/30* (2013.01); *G11C 16/32* (2013.01)

(58) Field of Classification Search
CPC .... G06F 3/0625; G06F 3/0653; G06F 3/0688; G11C 16/30; G11C 16/32

USPC .......................................................... 365/226
See application file for complete search history.

(56) References Cited

U.S. PATENT DOCUMENTS

| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,902,662 | B2 * | 12/2014 | Shiga ............... G11C 16/30 365/185.18 |
| 9,443,600 | B2 | 9/2016 | Ghalam et al. |
| 2011/0233648 | A1 | 9/2011 | Seol et al. |
| 2012/0020161 | A1 | 1/2012 | Haukness |
| 2012/0023346 | A1 * | 1/2012 | Byom ............... G06F 1/3225 713/320 |
| 2012/0063234 | A1 * | 3/2012 | Shiga ............... G11C 16/10 365/185.22 |
| 2013/0290611 | A1 | 10/2013 | Biederman et al. |
| 2015/0098272 | A1 | 4/2015 | Kasorla et al. |
| 2015/0200008 | A1 * | 7/2015 | Ozawa ............... G11C 5/025 365/185.08 |

(Continued)

*Primary Examiner* — Xiaochun L Chen

(74) *Attorney, Agent, or Firm* — Harness, Dickey & Pierce, P.L.C.

(57) ABSTRACT

A non-volatile memory device having a memory chip is provided. The memory chip having a memory cell array including a plurality of memory planes sharing a pad, the pad configured to communicate input and output signals. The memory chip also having a control circuit configured to monitor operations of the plurality of memory planes, and control an operation of at least one of the plurality of memory planes based on a result of the monitoring such that peak power intervals of the plurality of memory planes are at least partially distributed.

20 Claims, 21 Drawing Sheets

(56) References Cited

U.S. PATENT DOCUMENTS

| | | |
|---|---|---|
| 2016/0077961 A1 | 3/2016 | Erez et al. |
| 2016/0162215 A1 | 6/2016 | Jayaraman et al. |
| 2017/0060461 A1 | 3/2017 | Erez et al. |
| 2018/0203796 A1 | 7/2018 | Park et al. |

* cited by examiner

NON-VOLATILE MEMORY DEVICE INCLUDING MEMORY PLANES, AND OPERATING METHOD THEREOF

CROSS-REFERENCE TO RELATED APPLICATION

This application claims the benefit of Korean Patent Application No. 10-2017-0132752, filed on Oct. 12, 2017, in the Korean Intellectual Property Office, the disclosure of which is incorporated herein in its entirety by reference.

BACKGROUND

Some example embodiments relate to a memory device, and more particularly, to a non-volatile memory device including memory planes, and an operating method of the non-volatile memory device, which controls a peak power interval of each of the memory planes.

Memory devices are used to store data and are categorized into non-volatile memory devices and volatile memory devices. As an example of non-volatile memory devices, flash memory devices may be applied to portable phones, digital cameras, personal digital assistants (PDAs), mobile computer devices, fixed computer devices, and other devices. Recently, as information communication devices have been equipped with multiple functions, making large-capacity and highly integrated memory devices more desirable.

SUMMARY

Some example embodiments provide a non-volatile memory device including memory planes and an operating method of the non-volatile memory device.

According to some example embodiments, there is provided a non-volatile memory device including a memory chip. The memory chip includes a memory cell array including a plurality of memory planes sharing a pad, the pad configured to communicate input and output signals. The memory chip also includes a control circuit configured to monitor operations of the plurality of memory planes, and control an operation of at least one of the plurality of memory planes based on a result of the monitoring such that peak power intervals of the plurality of memory planes are at least partially distributed.

According to some example embodiments, there is provided a non-volatile memory device including a memory chip. The memory chip includes a memory cell array including a plurality of memory planes sharing a pad, the pad configured to communicate input and output signals. The memory chip also includes a control circuit configured to control an operation of at least one of the plurality of memory planes such that peak power intervals of the plurality of memory planes are at least partially distributed, the control circuit including a plurality of control logics corresponding to a respective memory plane of the plurality of memory planes, each of the plurality of control logics is configured to monitor whether an operation of the respective memory plane enters a peak power interval, generate a monitoring signal based on a result of the monitoring, and provide the generated monitoring signal to other control logics of the plurality of control logics.

According to some example embodiments, there is provided an operating method performed by a control circuit of a non-volatile memory device including a memory chip. The operating method includes monitoring operations of a plurality of memory planes included in the memory chip. The operating method also includes determining whether an operation of at least one of the plurality of memory planes corresponds to a peak power interval. The operating method also includes determining whether an operation of another memory plane of the plurality of memory planes corresponds to the peak power interval when the operation of the at least one of the plurality of memory planes corresponds to the peak power interval. Also, the operating method includes controlling the operations of the plurality of memory planes such that peak power intervals are at least partially distributed when the operation of the other memory plane corresponds to the peak power interval.

BRIEF DESCRIPTION OF THE DRAWINGS

Some example embodiments will be more clearly understood from the following detailed description taken in conjunction with the accompanying drawings in which.

DETAILED DESCRIPTION

Hereinafter, some example embodiments will be described in detail with reference to the accompanying drawings.

Figure 1:
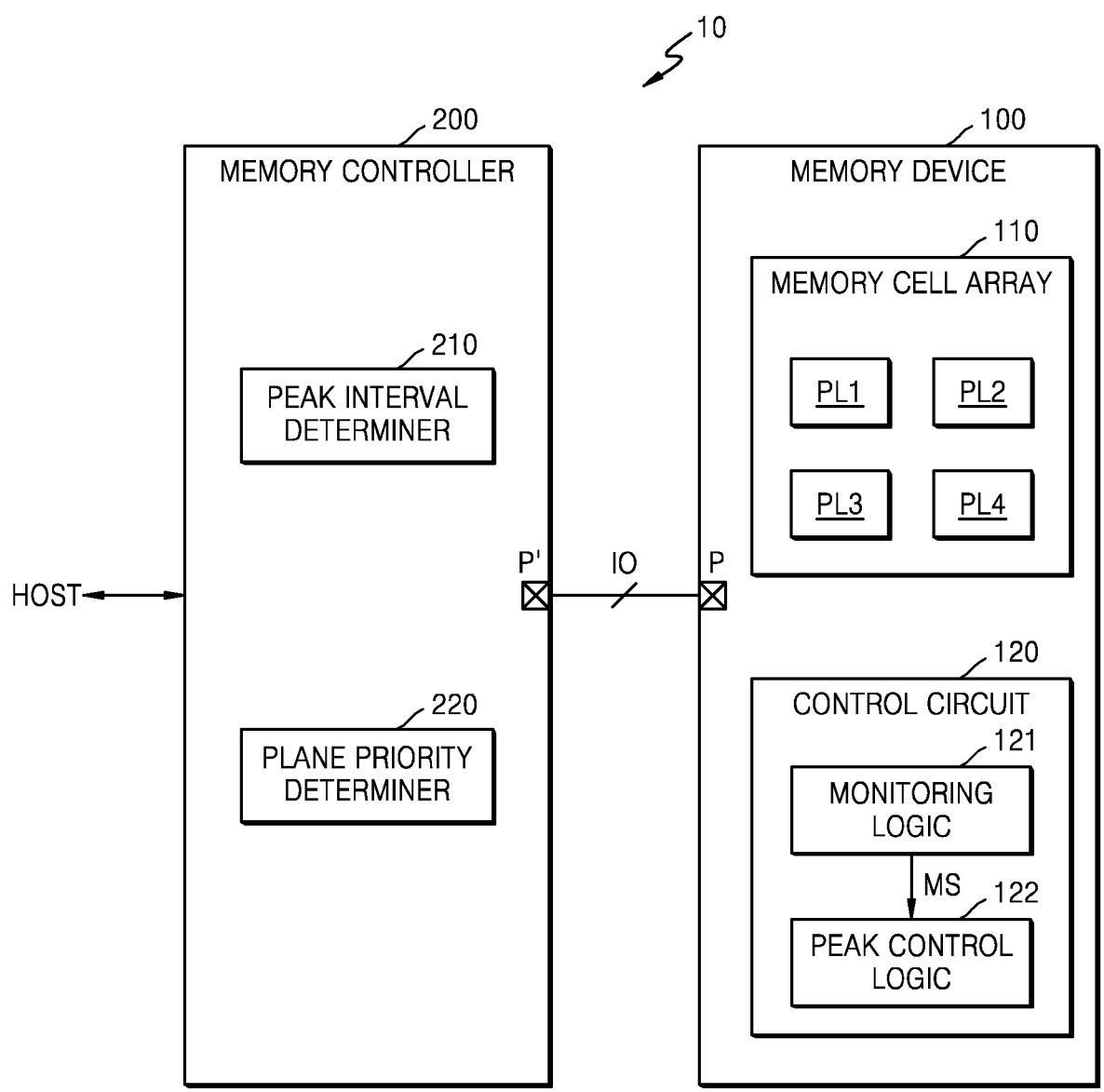
FIG. 1 is a block diagram schematically illustrating a memory system 10 according to some example embodiments.

FIG. 1 is a block diagram schematically illustrating a memory system 10 according to some example embodiments.

Referring to FIG. 1, the memory system 10 may include a memory device 100 and a memory controller 200. The memory device 100 may be a non-volatile memory device and may be implemented as a memory chip. The memory device 100 may include a memory cell array 110 and a control circuit 120, and the memory cell array 110 and the control circuit 120 may be implemented as a single memory chip. Hereinafter, the memory device 100 and a memory chip will be described as having substantially the same concepts. However, some example embodiments are not limited thereto. In some example embodiments, the memory device 100 may be implemented as a memory package including a plurality of memory chips, and the memory system 10 may include a plurality of memory chips or a plurality of memory packages.

In some example embodiments, the memory system 10 may be implemented with an internal memory embedded into an electronic device, and for example, may be an embedded universal flash storage (UFS) memory device, embedded multi-media card (eMMC), or solid state drive (SSD). In some example embodiments, the memory system 10 may be implemented with an external memory attachable/detachable on/from an electronic device, such as, for example, a UFS memory card, compact flash (CF) card, secure digital (SD) card, micro secure digital (Micro-SD) card, mini secure digital (Mini-SD) card, extreme digital (xD) card, or memory stick.

In response to a read/write request from a host HOST, the memory controller 200 may control the memory device 100 to read data stored in the memory device 100 or program data in the memory device 100. In detail, the memory controller 200 may provide an address, a command, and a control signal to the memory device 100 to control a program operation, a read operation, and a delete operation on the memory device 100. Also, data to program and read data may be transmitted or received between the memory controller 200 and the memory device 100.

For example, an address, a command, and data may be transmitted or received between the memory controller 200 and the memory device 100 through input/output (I/O) lines or I/O buses 10. The memory device 100 may include a plurality of I/O pads P respectively connected to the I/O buses 10, and for example, the plurality of I/O pads P may be exposed to a memory chip where the memory device 100 is implemented. The memory controller 200 may include a plurality of I/O pads P' respectively connected to the I/O buses 10, and for example, the plurality of I/O pads V may be exposed to a controller chip where the memory controller 200 is implemented.

The memory cell array 110 may include first to fourth memory planes PL1 to PL4, and the first to fourth memory planes PL1 to PL4 may share the I/O pads P. However, the number of memory planes included in the memory cell array 110 is not limited to four and may be variously changed according to some example embodiments. For example, the memory cell array 110 may include eight memory planes.

In some example embodiments, the memory cell array 110 may include flash memory. Hereinafter, some example embodiments where the memory cell array 110 includes a NAND flash memory will be described for example. However, some example embodiments are not limited thereto. In some example embodiments, the memory cell array 110 may include resistive memory devices such as resistive random access memory (ReRAM), phase change random access memory (PRAM), or magnetic random access memory (MRAM).

In some example embodiments, the memory cell array 110 may include a two-dimensional (2D) memory cell array, and the 2D memory cell array may include a plurality of NAND strings which are arranged in row and column directions. In some example embodiments, the memory cell array 110 may include a three-dimensional (3D) memory cell array, and the 3D memory cell array may include a plurality of NAND strings. Each of the NAND strings may include a plurality of memory cells respectively connected to word lines which are vertically stacked on a substrate. This will be described below with reference to FIGS. 6, 7A, and 7B. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Operations of the first to fourth memory planes PL1 to PL4 may be independently performed. For example, a program operation may be performed on the first memory plane PL1, and a read operation may be performed on the second to fourth memory planes PL2 to PL4. Therefore, since the memory device 100 includes the first to fourth memory planes PL1 to PL4, an effect similar to including four memory chips sharing an I/O bus IO is obtained, and performance of the memory system 10 is enhanced. Furthermore, the memory device 100 reduces latency after a request is received from the host HOST.

Due to independent and contemporaneous operations of the first to fourth memory planes PL1 to PL4, power consumed by the memory device 100 may be high. For example, when a voltage or a current used for an operation of the first memory plane PL1 is high, namely, when the operation of the first memory plane PL1 is a high-power operation, a voltage or a current used for an operation of the second memory plane PL2 which operates contemporaneously with the first memory plane PL1 may also be high. In this case, the voltage or the current may exceed a range of a current or power capable of being supplied by an external power management module (for example, a power management integrated circuit (PMIC)) included in an electronic device including the memory system 10, and for this reason, the reliability of the memory system 10 is reduced.

The control circuit 120 may monitor operations of the first to fourth memory planes PL1 to PL4 and may control an operation of at least one of the first to fourth memory planes PL1 to PL4 so that peak power intervals of the first to fourth memory planes PL1 to PL4 are at least partially distributed, based on a result of the monitoring. For example, if peak power intervals of at least some of the first to fourth memory planes PL1 to PL4 overlap each other, the control circuit 120 may delay an operation of at least one of the at least some memory planes to distribute peak power intervals.

Here, the peak power intervals may be intervals where power consumed by an operation of each of the first to fourth memory planes PL1 to PL4 is equal to or greater than a threshold value. The peak power intervals may be referred to as peak current intervals or peak control intervals. For example, the peak power intervals may include at least one of a bit line setup interval for a program operation, a bit line precharge interval for a read operation, and a latch initialization interval before the program operation or the read operation.

In some example embodiments, the peak power intervals may be determined by a peak interval determiner 210 of the memory controller 200, and the memory controller 200 may provide peak interval information to the memory device 100 by using a set feature command. For example, the peak interval determiner 210 may be implemented with hardware, software, or firmware. In some example embodiments, the peak power intervals may be determined in a process of releasing the memory device 100 and may be programmed in a partial region of the memory cell array 110. The memory controller 200 may read information about the peak power intervals from the memory cell array 110 through information data read (IDR). In some example embodiments, priorities between the first to fourth memory planes PL1 to PL4 may be determined by a plane priority determiner 220 of the memory controller 200. In some example embodiments, operations described herein as being performed by any or all of the peak interval determiner 210 and the plane priority determiner 220 may be performed by any suitable means capable of performing the operations, such as various hardware and/or software implemented in some form of hardware (e.g., processor, ASIC, etc.). For example, the operations may be performed by at least one processor (e.g., the memory controller 200) executing program code that includes instructions corresponding to the operations. The instructions may be stored in a memory. The term 'processor,' as used in the present disclosure, may refer to, for example, a hardware-implemented data processing device having circuitry that is physically structured to execute desired operations including, for example, operations represented as code and/or instructions included in a program. In at least some example embodiments the above-referenced hardware-implemented data processing device may include, but is not limited to, a controller, a microprocessor, a central processing unit (CPU), a processor core, a multi-core processor; a multiprocessor, an application-specific integrated circuit (ASIC), and a field programmable gate array (FPGA).

In some example embodiments, the control circuit 120 may include a monitoring logic 121 and a peak control logic 122. The monitoring logic 121 may monitor whether operations of the first to fourth memory planes PL1 to PL4 enter the peak power interval, and may generate a monitoring signal MS, based on a result of the monitoring. The peak control logic 122 may delay or suspend a peak power interval of at least one of the first to fourth memory planes PL1 to PL4 so that the respective peak power intervals of the first to fourth memory planes PL1 to PL4 are at least partially distributed, based on the monitoring signal MS. In some example embodiments, the operations of the control circuit 120, monitoring logic 121 and peak logic 122 may be performed by any suitable means capable of performing the operations, such as various hardware and/or software implemented in some form of hardware (e.g., processor, ASIC, etc.). For example, the control circuit 120 may be implemented using hardware and operations described herein as being performed by any or all of the monitoring logic 121 and the peak control logic 122 may be performed by corresponding hardware. In some example embodiments, the control circuit 120 may be a processor and operations described herein as being performed by any or all of the monitoring logic 121 and the peak control logic 122 may be performed by at least one processor (e.g., the control circuit 120) executing program code that includes instructions corresponding to the operations. The instructions may be stored in a memory (e.g., the memory cell array 110).

Figure 2A:
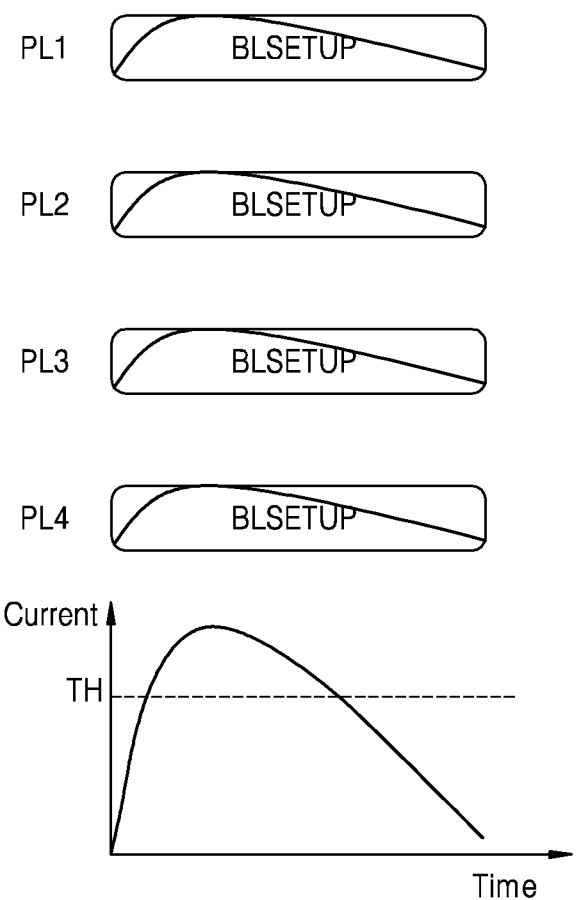
FIGS. 2A to 2C illustrate a peak control operation of a memory device of FIG. 1 in which the operations of the memory planes include a bit line setup interval, according to some example embodiments.
Figure 2B:
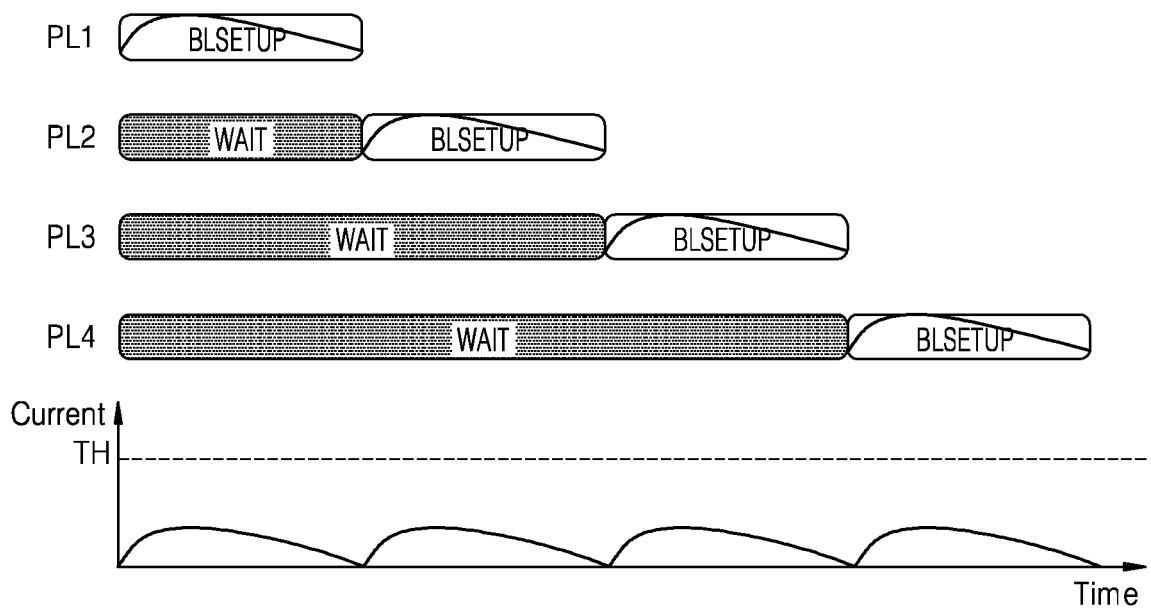
Figure 2C:
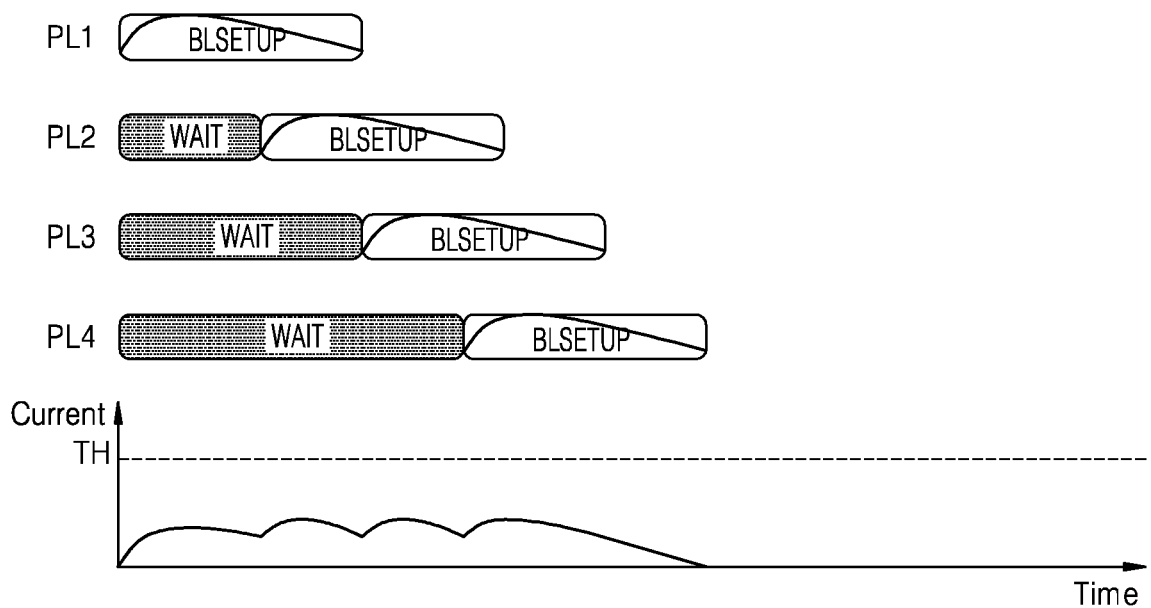

FIGS. 2A to 2C illustrate a peak control operation of the memory device 100 of FIG. 1 in which the operations of the memory planes include a bit line setup interval according to some example embodiments.

Referring to FIG. 2A, operations of the first to fourth memory planes PL1 to PL4 may all correspond to a peak power interval. For example, the operations of the first to fourth memory planes PL1 to PL4 may all correspond to a bit line setup interval BLSETUP. In this case, the amount of current used for the operation of each of the first to fourth memory planes PL1 to PL4 may have a peak value at an initial stage of the bit line setup interval BLSETUP.

In this manner, when the bit line setup intervals BLSETUP of the first to fourth memory planes PL1 to PL4 overlap one another, the total amount of current of the memory device 100 including the first to fourth memory planes PL1 to PL4 may have a peak value, and in this case, the peak value may be higher than a threshold current amount TH. As a result, power consumed by the memory device 100 may exceed an upper current limit of a current or an upper power limit of power capable of being supplied by the external power management module (for example, the PMIC), and for this reason, it is difficult to ensure a normal operation of the memory device 100.

Referring to FIG. 2B, the control circuit 120 may temporally distribute the operations of the first to fourth memory planes PL1 to PL4 in order for the bit line setup intervals BLSETUP of the first to fourth memory planes PL1 to PL4 not to overlap one another. In some example embodiments, the control circuit 120 may temporally and completely distribute the operations of the first to fourth memory planes PL1 to PL4 in order for the bit line setup intervals BLSETUP of the first to fourth memory planes PL1 to PL4 not to overlap one another at all. Therefore, the total amount of current of the memory device 100 may be far lower than the threshold current amount TH, and power consumed by the memory device 100 may be sufficiently lower than the upper power limit of the power capable of being supplied by the PMIC.

For example, during a bit line setup interval BLSETUP of the first memory plane PL1, a bit line setup operation may be normally performed on the first memory plane PL1, and bit line setup operations on the second to fourth memory planes PL2 to PL4 may suspend. Subsequently, when the bit line setup interval BLSETUP of the first memory plane PL1 ends, a bit line setup operation on the second memory plane PL2 may resume, and bit line setup operations on the third and fourth memory planes PL3 and PL4 may continue to suspend. Subsequently, when the bit line setup interval BLSETUP of the second memory plane PL2 ends, the bit line setup operation on the third memory plane PL3 may resume, and the bit line setup operation on the fourth memory plane PL4 may continue to suspend. Subsequently, when the bit line setup interval BLSETUP of the third memory plane PL3 ends, the bit line setup operation on the fourth memory plane PL4 may resume.

Referring to FIG. 2C, the control circuit 120 may temporally and partially distribute the operations of the first to fourth memory planes PL1 to PL4 so that the bit line setup intervals BLSETUP of the first to fourth memory planes PL1 to PL4 do not completely overlap one another. As described above with reference to FIG. 2A, the amount of current used for the operation of each of the first to fourth memory planes PL1 to PL4 may have a peak value at an initial stage of the bit line setup interval BLSETUP. Therefore, the control circuit 120 may temporally distribute the operations of the first to fourth memory planes PL1 to PL4 in order for initial intervals of the bit line setup intervals BLSETUP of the first to fourth memory planes PL1 to PL4 not to overlap one another. Accordingly, the total amount of current of the memory device 100 may be far lower than the threshold current amount TH, and the power consumed by the memory device 100 may be sufficiently lower than the upper power limit of the power capable of being supplied by the PMIC.

For example, during the bit line setup interval BLSETUP of the first memory plane PL1, the bit line setup operation may be normally performed on the first memory plane PL1, and during an initial partial interval of the bit line setup interval BLSETUP of the first memory plane PL1, the bit line setup operations on the second to fourth memory planes PL2 to PL4 may suspend. Subsequently, when the bit line setup interval BLSETUP of the first memory plane PL1 ends, the bit line setup operation on the second memory plane PL2 may resume, and bit line setup operations on the third and fourth memory planes PL3 and PL4 may continue to suspend. Subsequently, when an initial partial interval of the bit line setup interval BLSETUP of the second memory plane PL2 ends, the bit line setup operation on the third memory plane PL3 may resume, and the bit line setup operation on the fourth memory plane PL4 may continue to suspend. Subsequently, when an initial partial interval of the bit line setup interval BLSETUP of the third memory plane PL3 ends, the bit line setup operation on the fourth memory plane PL4 may resume.

Figure 3A:
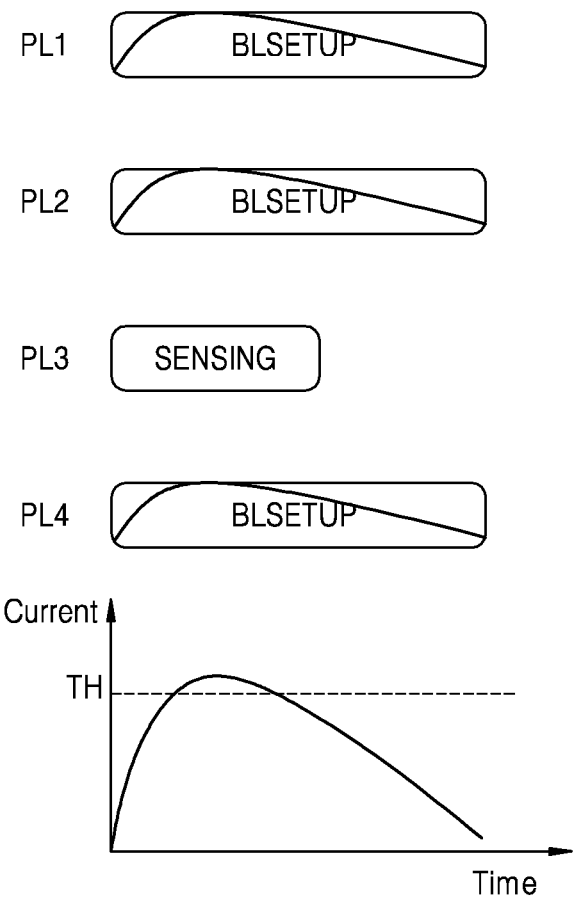
FIGS. 3A to 3C illustrate a peak control operation of a memory device of FIG. 1 in which the operations of the memory planes include a bit line setup interval and a sensing interval, according to some example embodiments.
Figure 3B:
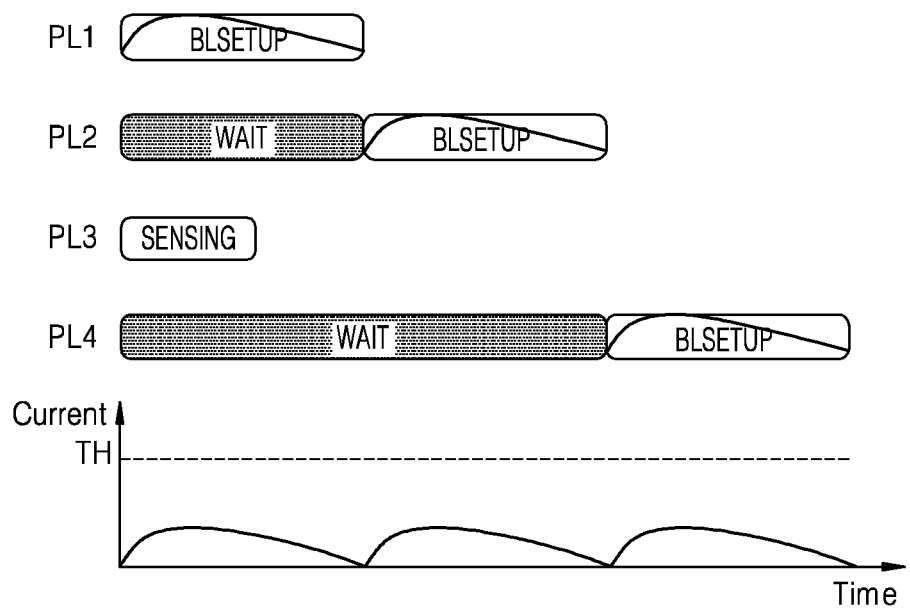
Figure 3C:
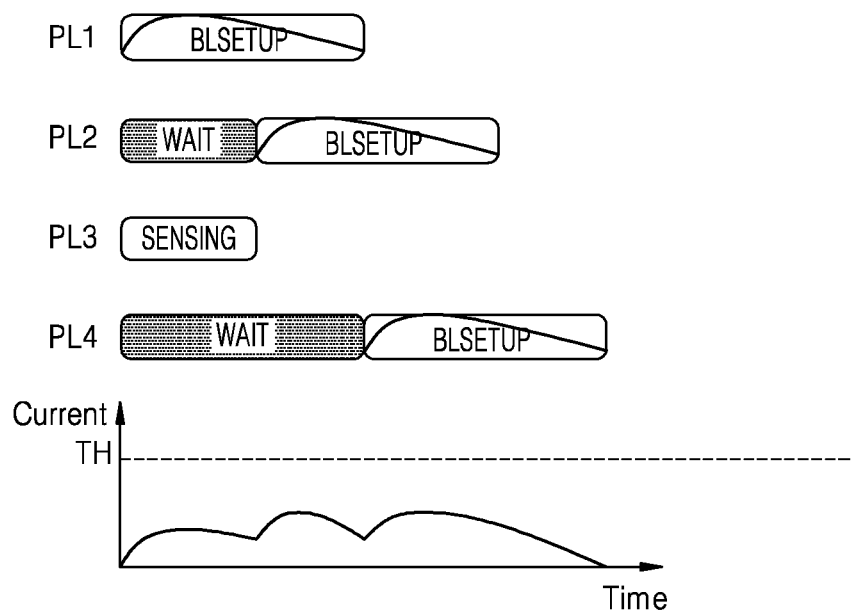

FIGS. 3A to 3C illustrate a peak control operation of the memory device 100 of FIG. 1 in which the operations of the memory planes include a bit line setup interval and a sensing interval according to some example embodiments.

Referring to FIG. 3A, some of the operations of the first to fourth memory planes PL1 to PL4 may correspond to the peak power interval. For example, the first, second, and fourth memory planes PL1, PL2, and PL4 may correspond to the bit line setup interval BLSETUP, and the operation of the third memory plane PL3 may correspond to a sensing interval SENSING. Here, the sensing interval SENSING may correspond to an interval after a precharge interval and a develop interval in a read operation, and the amount of consumed current or power may not be relatively large in the sensing interval SENSING. In this case, the amount of current used for the operation of each of the first, second, and fourth memory planes PL1, PL2, and PL4 may have a peak value at an initial stage of the bit line setup interval BLSETUP.

In this manner, when the bit line setup intervals BLSETUP of the first, second, and fourth memory planes PL1, PL2, and PL4 overlap one another, the total amount of current of the memory device 100 including the first to fourth memory planes PL1 to PL4 may have a peak value, and in this case, the peak value may be higher than the threshold current amount TH. As a result, power consumed by the memory device 100 may exceed the upper current limit of the current or the upper power limit of the power capable of being supplied by the external power management module (for example, the PMIC), and for this reason, it is difficult to ensure the normal operation of the memory device 100.

Referring to FIG. 3B, the control circuit 120 may temporally distribute the operations of the first, second, and fourth memory planes PL1, PL2, and PL4 in order for the bit line setup intervals BLSETUP of the first, second, and fourth memory planes PL1, PL2, and PL4 not to overlap one another. In some example embodiments, the control circuit 120 may temporally and completely distribute the operations of the first, second, and fourth memory planes PL1, PL2, and PL4 in order for the bit line setup intervals BLSETUP of the first, second, and fourth memory planes PL1, PL2, and PL4 not to overlap one another at all. At this time, the control circuit 120 may normally perform the operation of the third memory plane PL3, and thus, the bit line setup interval BLSETUP of the first memory plane PL1 may overlap the sensing interval SENSING of the third memory plane PL3. Therefore, the total amount of current of the memory device 100 may be far lower than the threshold current amount TH, and power consumed by the memory device 100 may be sufficiently lower than the upper power limit of the power capable of being supplied by the PMIC.

For example, during the bit line setup interval BLSETUP of the first memory plane PL1, the bit line setup operation may be normally performed on the first memory plane PL1, a sensing operation may be normally performed on the third memory plane PL3, and the bit line setup operations on the second and fourth memory planes PL2 and PL4 may suspend. Subsequently, when the bit line setup interval BLSETUP of the first memory plane PL1 ends, the bit line setup operation on the second memory plane PL2 may resume, and the bit line setup operations on the fourth memory plane PL4 may continue to suspend. Subsequently, when the bit line setup interval BLSETUP of the second memory plane PL2 ends, the bit line setup operation on the fourth memory plane PL4 may resume.

Referring to FIG. 3C, the control circuit 120 may temporally and partially distribute the operations of the first, second, and fourth memory planes PL1, PL2, and PL4 so that the bit line setup intervals BLSETUP of the first, second, and fourth memory planes PL1, PL2, and PL4 do not completely overlap one another. As described above with reference to FIG. 3A, the amount of current used for the operation of each of the first, second, and fourth memory planes PL1, PL2, and PL4 may have a peak value at an initial stage of the bit line setup interval BLSETUP. Therefore, the control circuit 120 may temporally distribute the operations of the first, second, and fourth memory planes PL1, PL2, and PL4 in order for initial intervals of the bit line setup intervals BLSETUP of the first, second, and fourth memory planes PL1, PL2, and PL4 not to overlap one another. Accordingly, the total amount of current of the memory device 100 may be far lower than the threshold current amount TH, and the power consumed by the memory device 100 may be sufficiently lower than the upper power limit of the power capable of being supplied by the PMIC.

For example, during the bit line setup interval BLSETUP of the first memory plane PL1, the bit line setup operation may be normally performed on the first memory plane PL1, the sensing operation may be normally performed on the third memory plane PL3, and the bit line setup operations on the second and fourth memory planes PL2 and PL4 may suspend. Subsequently, when an initial partial interval of the bit line setup interval BLSETUP of the first memory plane PL1 ends, the bit line setup operation on the second memory plane PL2 may resume, and the bit line setup operation on the fourth memory plane PL4 may continue to suspend. Subsequently, when an initial partial interval of the bit line setup interval BLSETUP of the second memory plane PL2 ends, the bit line setup operation on the fourth memory plane PL4 may resume.

Figure 4:
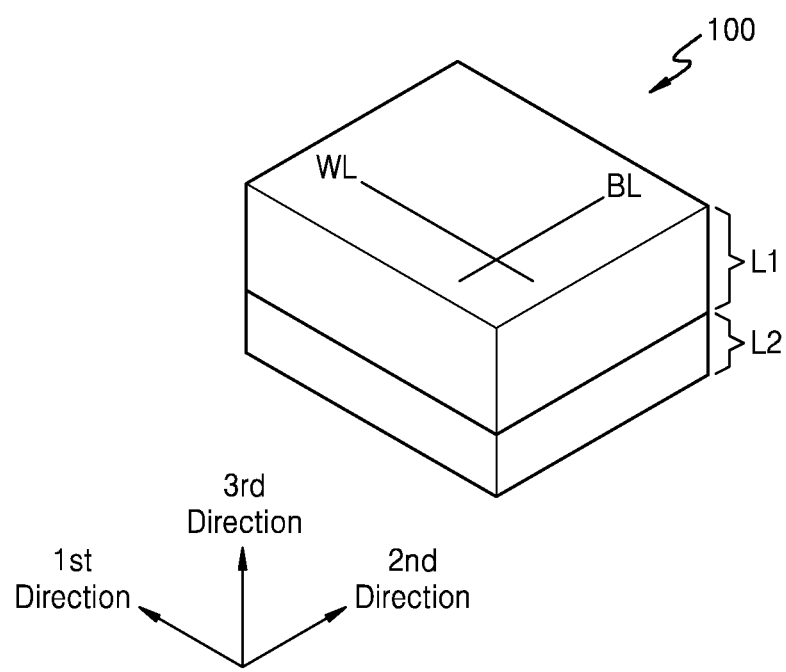
FIG. 4 schematically illustrates a structure of a memory device of FIG. 1, according to some example embodiments.

FIG. 4 schematically illustrates a structure of the memory device 100 of FIG. 1 according to some example embodiments.

Referring to FIG. 4, the memory device 100 may include a first semiconductor layer L1 and a second semiconductor layer L2. The first semiconductor layer L1 may be stacked on the second semiconductor layer L2 in a third direction. In some example embodiments, the memory cell array 110 of FIG. 1 may be provided on the first semiconductor layer L1, and the control circuit 120 of FIG. 1 may be provided on the second semiconductor layer L2. Therefore, the memory device 100 may have a structure (e.g., a cell over periphery (COP) structure) where the memory cell array 110 is disposed on the control circuit 120. For example, a peripheral circuit except the memory cell array 110 may be disposed under the memory cell array 110, and thus, the COP structure may effectively reduce an area occupied in a surface vertical to a stacked direction and may enhance a degree of integration of the memory device 100.

The second semiconductor layer L2 may include a substrate, and semiconductor devices such as transistors and a pattern for wiring devices may be provided on the substrate, whereby circuits including the control circuit 120 may be provided on the second semiconductor layer L2. After the circuits are provided on the second semiconductor layer L2, the first semiconductor layer L1 including the memory cell array 110 may be provided, and patterns for electrically connecting word lines WL and bit lines BL of the memory cell array 110 to the circuits provided on the second semiconductor layer L2 may be provided.

Figure 5:
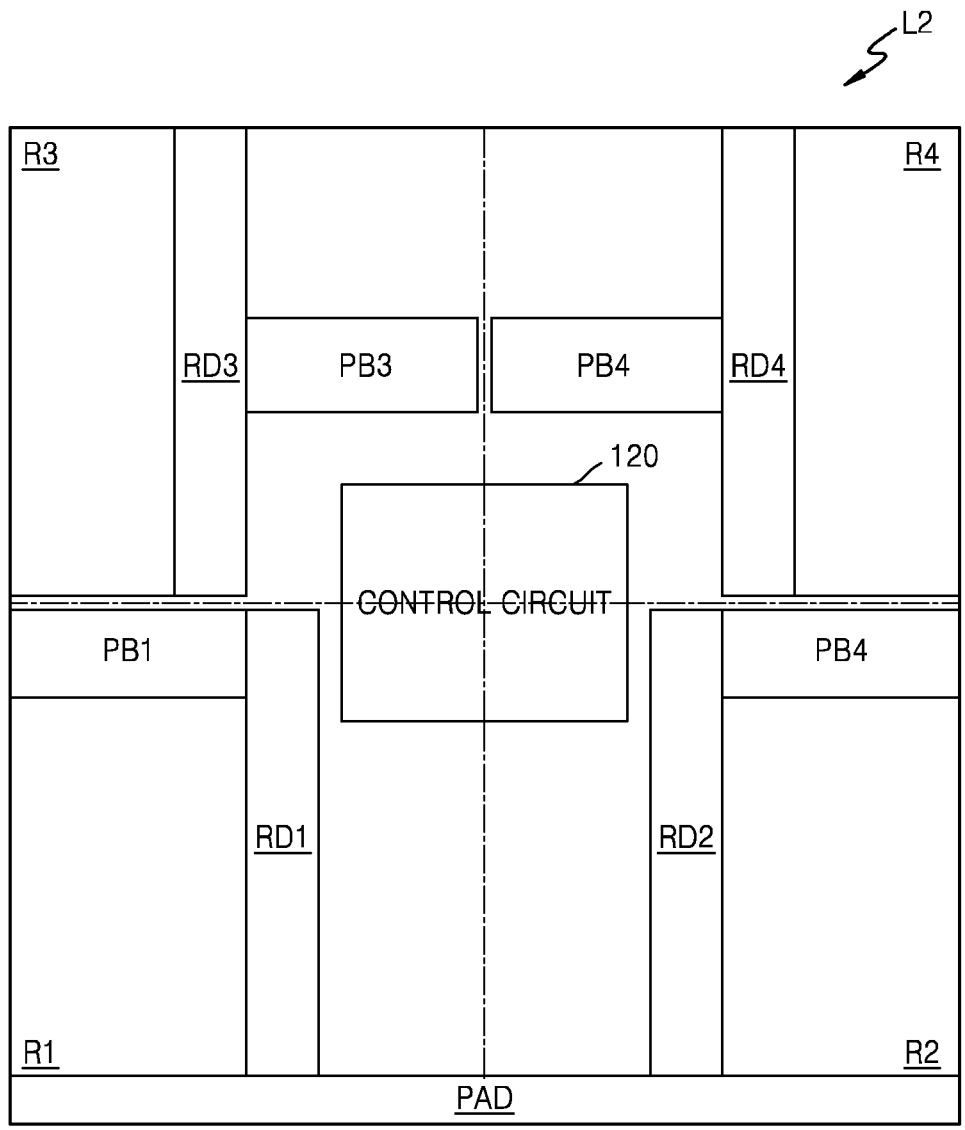
FIG. 5 is a plan view illustrating an upper surface of a second semiconductor layer of FIG. 4, according to some example embodiments.

FIG. 5 is a plan view illustrating an upper surface of the second semiconductor layer L2 of FIG. 4 according to some example embodiments.

Referring to FIGS. 1 and 5, the second semiconductor layer L2 may include a pad region PAD and a peripheral circuit region, and the peripheral circuit region may include first to fourth regions R1 to R4. The plurality of I/O pads P may be provided in the pad region PAD, and the plurality of I/O pads P may be connected to the first to fourth regions R1 to R4 through metal wirings on the second semiconductor layer L2. The first memory plane PL1 may be disposed in an upper portion of the first region R1, the second memory plane PL2 may be disposed in an upper portion of the second region R2, the third memory plane PL3 may be disposed in an upper portion of the third region R3, and the fourth memory plane PL4 may be disposed in an upper portion of the fourth region R4.

A first row decoder RD1 and a first page buffer PB1 may be disposed in the first region R1 and may be connected to the first memory plane PL1. A second row decoder RD2 and a second page buffer PB2 may be disposed in the second region R2 and may be connected to the second memory plane PL2. A third row decoder RD3 and a third page buffer PB3 may be disposed in the third region R3 and may be connected to the third memory plane PL3. A fourth row decoder RD4 and a fourth page buffer PB4 may be disposed in the fourth region R4 and may be connected to the fourth memory plane PL4. In FIG. 5, it is illustrated that one row decoder and one page buffer are disposed in each of the first to fourth regions R1 to R4, but some example embodiments are not limited thereto. In some example embodiments, a plurality of row decoders and a plurality of page buffers may be disposed in each of the first to fourth regions R1 to R4.

The control circuit 120 may be disposed in a certain region of the peripheral circuit region. The control circuit 120 may be connected to the first to fourth row decoders RD1 to RD4 and the first to fourth page buffers PB1 to PB4. Therefore, the control circuit 120 may monitor the operations of the first to fourth memory planes PL1 to PL4, and based on a result of the monitoring, the control circuit 120 may control the operations of the first to fourth memory planes PL1 to PL4 so that the peak power intervals of the first to fourth memory planes PL1 to PL4 are at least partially distributed. In FIG. 5, the control circuit 120 is illustrated as being disposed in the center region of the peripheral circuit region, but some example embodiments are not limited thereto. In some example embodiments, the control circuit 120 may be disposed in at least one of the first to fourth row decoders RD1 to RD4.

Figure 6:
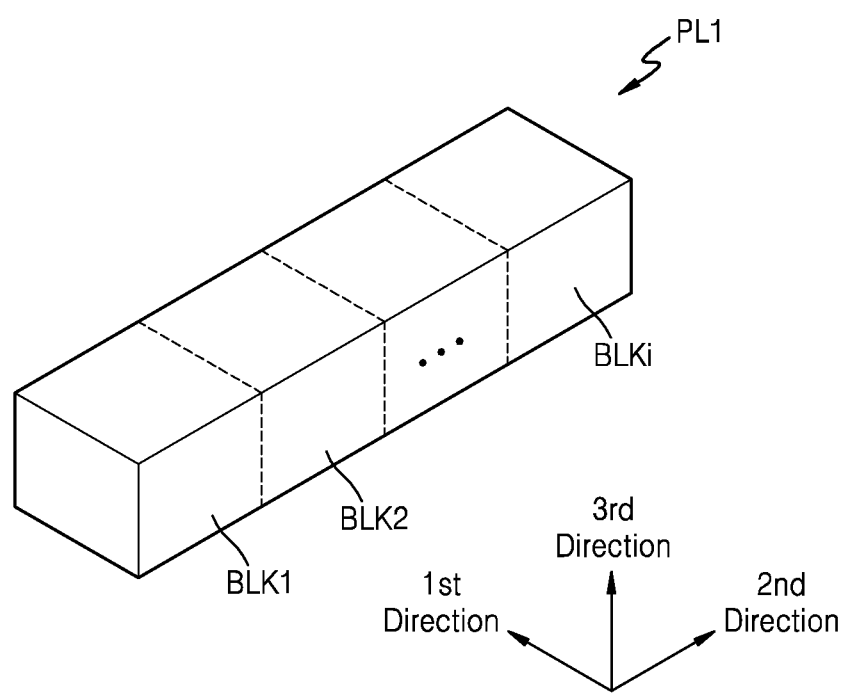
FIG. 6 illustrates a first memory plane of FIG. 1, according to some example embodiments.

FIG. 6 illustrates the first memory plane PL1 of FIG. 1 according to some example embodiments.

Referring to FIG. 6, the first memory plane PL1 may include a plurality of memory blocks BLK1 to BLKi. Each of the plurality of memory blocks BLK1 to BLKi may include a 3D structure (or a vertical structure). In detail, each of the plurality of memory blocks BLK1 to BLKi may include structures which extend in first and second directions. For example, each of the plurality of memory blocks BLK1 to BLKi may include a plurality of NAND strings which extend in a third direction. In this case, the plurality of NAND strings may be provided along the first and second directions and may be spaced apart from each other by a certain distance.

Referring to FIGS. 5 and 6, the plurality of memory blocks BLK1 to BLKi may be selected by the first row decoder RD1. For example, the first row decoder RD1 may select a memory block corresponding to a block address from among the plurality of memory blocks BLK1 to BLKi. The second to fourth memory planes PL2 to PL4 of FIG. 1 may be substantially implemented similarly to the first memory plane PL1, and details described above with reference to FIG. 6 may be applied to the second to fourth memory planes PL2 to PL4.

Figure 7A:
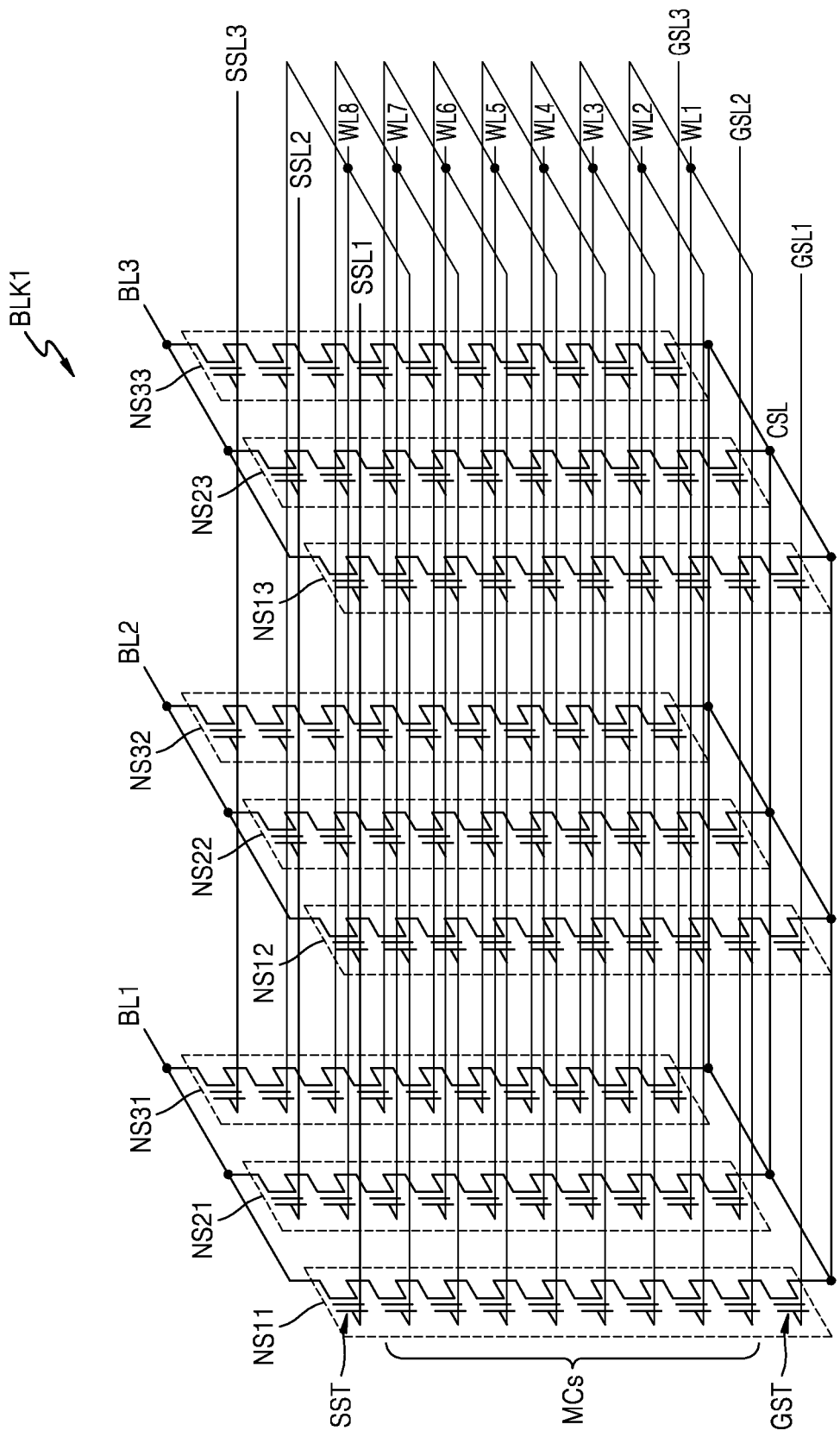
FIG. 7A is a circuit diagram illustrating an equivalent circuit of a first memory block of FIG. 6, according to some example embodiments.

FIG. 7A is a circuit diagram illustrating an equivalent circuit of a first memory block BLK1 of FIG. 6 according to some example embodiments.

Referring to FIG. 7A, the first memory block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of the NAND strings, the number of the word lines, the number of the bit lines, the number of the ground selection lines, and the number of the string selection lines may be variously changed according to some example embodiments.

A plurality of NAND strings NS11, NS21, and NS31 may be provided between a first bit line BL1 and the common source line CSL, a plurality of NAND strings NS12, NS22, and NS32 may be provided between a second bit line BL2 and the common source line CSL, and a plurality of NAND strings NS13, NS23, and NS33 may be provided between a third bit line BL3 and the common source line CSL. Each (for example, NS11) of the NAND strings may include a string selection transistor SST, a plurality of memory cells MC, and a ground selection transistor GST.

The string selection transistor SST may be connected to the string selection lines SSL1 to SSL3 corresponding thereto. Each of the plurality of memory cells MC may be connected to the word lines WL1 to WL8 corresponding thereto. The ground selection transistor GST may be connected to the ground selection lines GSL1 to GSL3 corresponding thereto. The string selection transistor SST may be connect to the bit lines BL1 to BL3 corresponding thereto, and the ground selection transistor GST may be connected to the common source line CSL.

In some example embodiments, a word line (for example, WL1) having the same height as that of each of lines may be connected to the lines in common, the string selection lines SSL1 to SSL3 may be separated from one another, and the ground selection lines GSL1 to GSL3 may be separated from one another. In FIG. 7A, three string selection lines SSL1 to SSL3 are illustrated as sharing a word line having the same height, but some example embodiments are not limited thereto. For example, two string selection lines may share a word line having the same height. As another example, four string selection lines may share a word line having the same height.

Figure 7B:
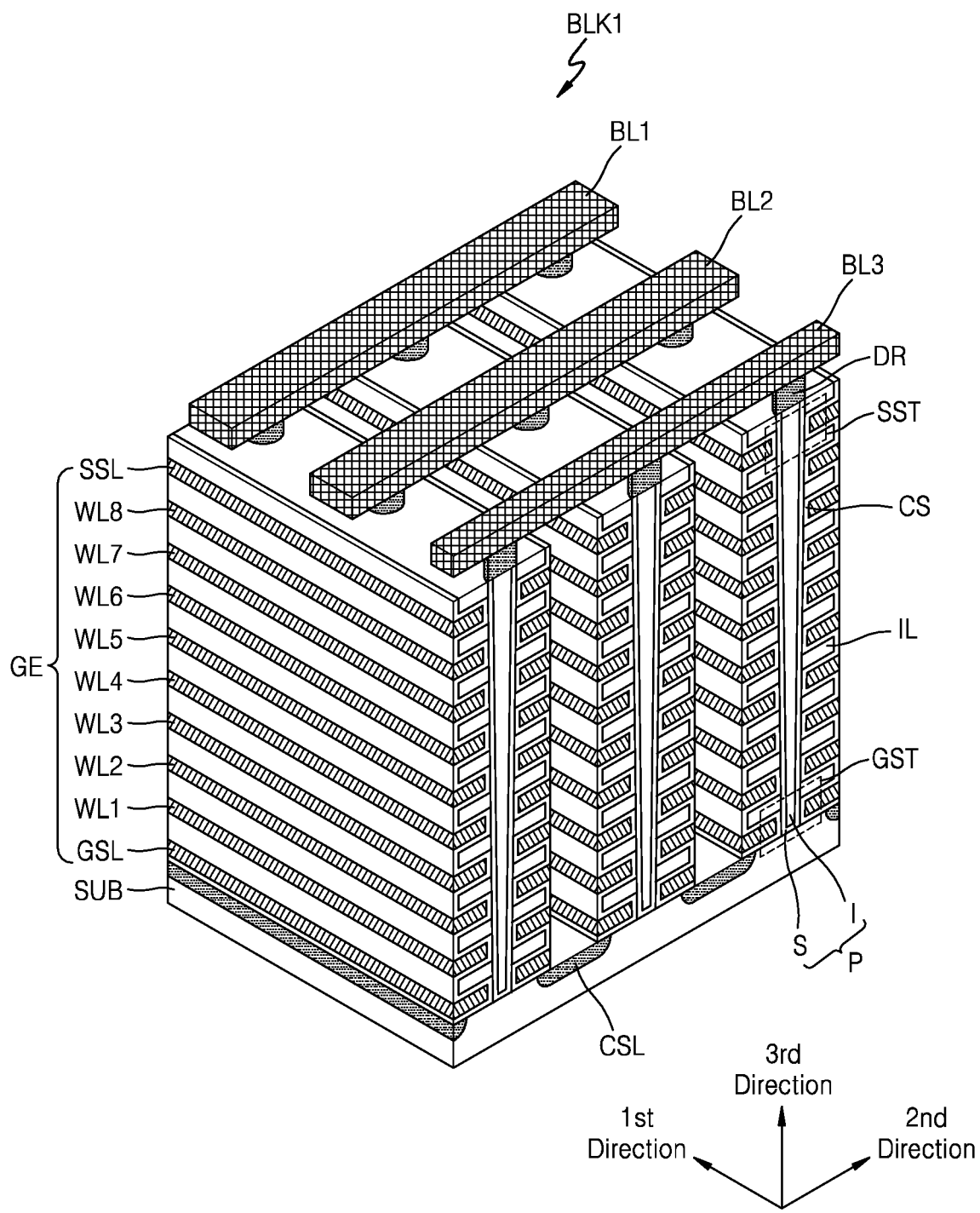
FIG. 7B is a perspective view illustrating the first memory block of FIG. 6, according to some example embodiments.

FIG. 7B is a perspective view illustrating the first memory block BLK1 of FIG. 6 according to some example embodiments.

Referring to FIG. 7B, the first memory block BLK1 may be provided in a vertical direction with respect to a substrate SUB. The substrate SUB may have a first conductive type (for example, a p type), and the common source line CSL which extends in the first direction and is doped with impurities having a second conductive type (for example, an n type) may be provided on the substrate SUB. A plurality of insulation layers IL extending in the first direction may be sequentially provided along the third direction in a region of the substrate SUB between two adjacent common source lines CSL, and may be spaced apart from each other by a certain distance along the third direction. For example, the plurality of insulation layers IL may include an insulating material such as silicon oxide.

A plurality of pillars P, which are sequentially arranged along the first direction and pass through the plurality of insulation layers IL along the third direction, may be provided in a region of the substrate SUB between two adjacent common source lines CSL. For example, the plurality of pillars P may contact the substrate SUB through the plurality of insulation layers IL. In detail, a surface layer S of each of the pillars P may include a silicon material having a first type and may function as a channel region. An internal layer I of each pillar P may include an air gap or an insulating material such as silicon oxide.

The insulation layers IL, the pillars P, and a charge storage layer CS provided along an exposed surface of the substrate SUB may be provided in a region of the substrate SUB between two adjacent common source lines CSL. The charge storage layer CS may include a gate insulation layer (or referred to as a tunneling insulation layer), a charge trap layer, and a blocking insulation layer. For example, the charge storage layer CS may have an oxide-nitride-oxide (ONO) structure. Also, a gate electrode GE including the selection lines GSL and SSL and the word lines WL1 to WL8 may be provided on an exposed surface of the charge storage layer CS and in a region of the substrate SUB between two adjacent common source lines CSL.

A plurality of drains or drain contacts DR may be respectively provided on the plurality of pillars P. For example, the drains or drain contacts DR may include a silicon material doped with impurities having the second conductive type. The bit lines BL1 to BL3 which extend in the second direction and are spaced apart from each other by a certain distance along the first direction may be provided on the drains DR.

Figure 8:
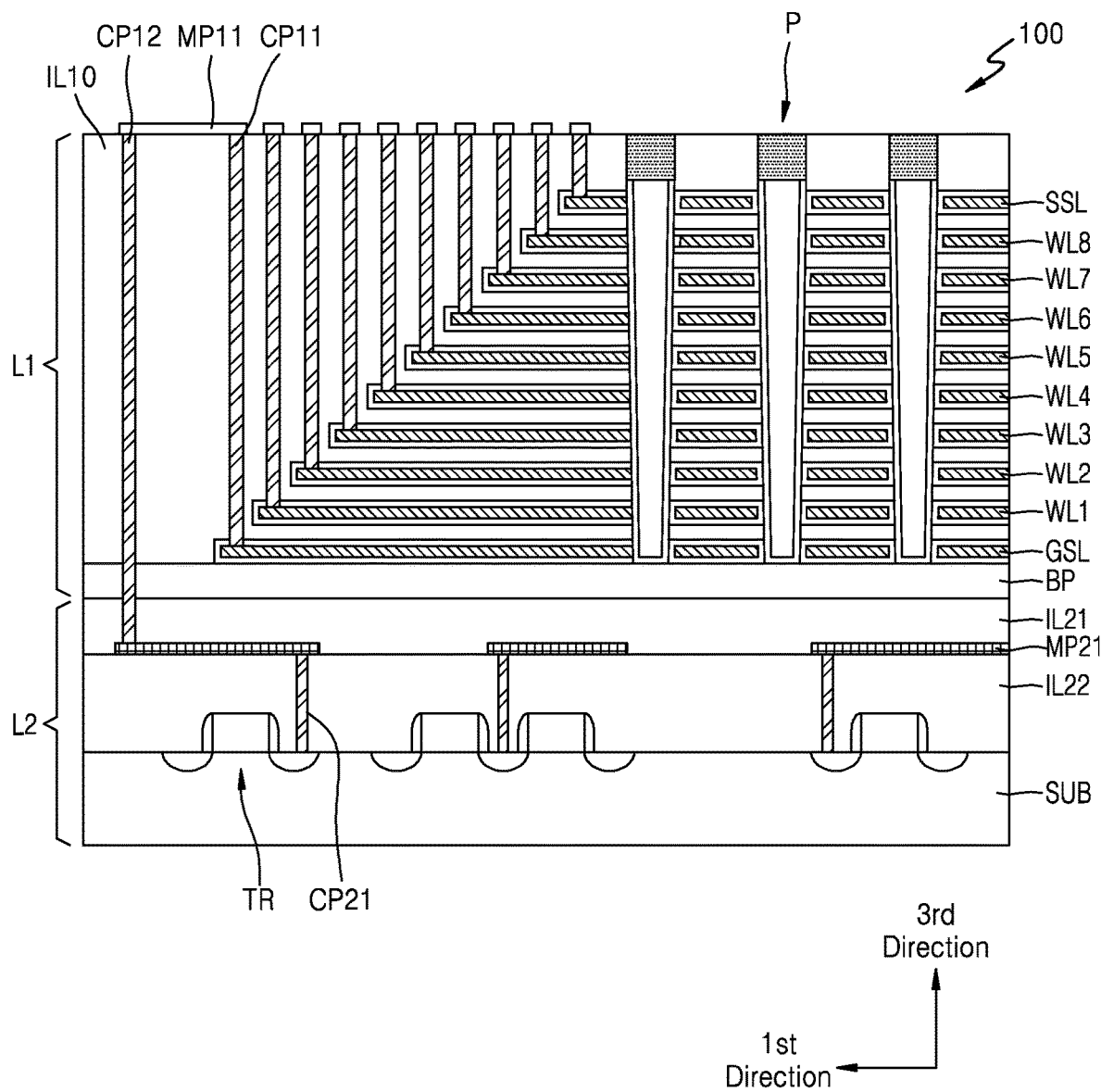
FIG. 8 is a cross-sectional view illustrating a memory device of FIG. 5, according to some example embodiments.

FIG. 8 is a cross-sectional view illustrating the memory device 100 of FIG. 5 according to some example embodiments.

Referring to FIG. 8, the second semiconductor layer L2 may include the substrate SUB, a second lower insulation layer IL22, and a first lower insulation layer IL21, and the control circuit 120 of FIG. 1 may be disposed on the second semiconductor layer L2. The substrate SUB may be a semiconductor substrate including a semiconductor material such as crystalline silicon or crystalline germanium and may be manufactured from a silicon wafer. The first and second lower insulation layers IL21 and IL22 may be formed of an insulating material such as silicon oxide through a chemical vapor deposition (CVD) process, a spin process, or the like.

A plurality of semiconductor devices (for example, transistors TR) may be provided on the substrate SUB included in the second semiconductor layer L2 and may be electrically connected to a metal pattern MP21 provided on the first lower insulation layer IL21 through a contact plug CP21 passing through the second lower insulation layer IL22. The semiconductor devices provided on the second semiconductor layer L2 may configure a circuit corresponding to the control circuit 120, the first to fourth row decoders RD1 to RD4, and the first to fourth page buffers PB1 to PB4.

The first semiconductor layer L1 may be stacked on the second semiconductor layer L2, and the memory cell array 110 of FIG. 1 may be disposed on the first semiconductor layer L1. The first semiconductor layer L1 may include a base layer BP and an upper insulation layer IL10. In some example embodiments, the base layer BP may be formed of polysilicon through a sputtering process, a CVD process, an atomic layer deposition (ALD) process, a physical vapor deposition (PVD) process, or the like. In some example embodiments, an amorphous silicon layer may be formed on the first lower insulation layer IL21, and then, by changing the amorphous silicon layer to a crystalline silicon layer through thermal treatment or irradiation of a laser beam, the base layer BP may be formed, thereby removing an internal defect of the base layer BP. In some example embodiments, the base layer BP may be formed through a wafer bonding process, and in this case, a crystalline silicon wafer may be attached on the first lower insulation layer IL21, and by partially removing or planarizing an upper portion of the crystalline silicon wafer, the base layer BP may be formed.

Moreover, in the first semiconductor layer L1, as described above with reference to FIG. 7B, the string selection line SSL, the word lines WL1 to WL8, and the ground selection line GSL may be stacked on the base layer BP in the third direction, and the pillars P passing through the stacked string selection line SSL, word lines WL1 to WL8, and ground selection line GSL may be formed.

Figure 9:
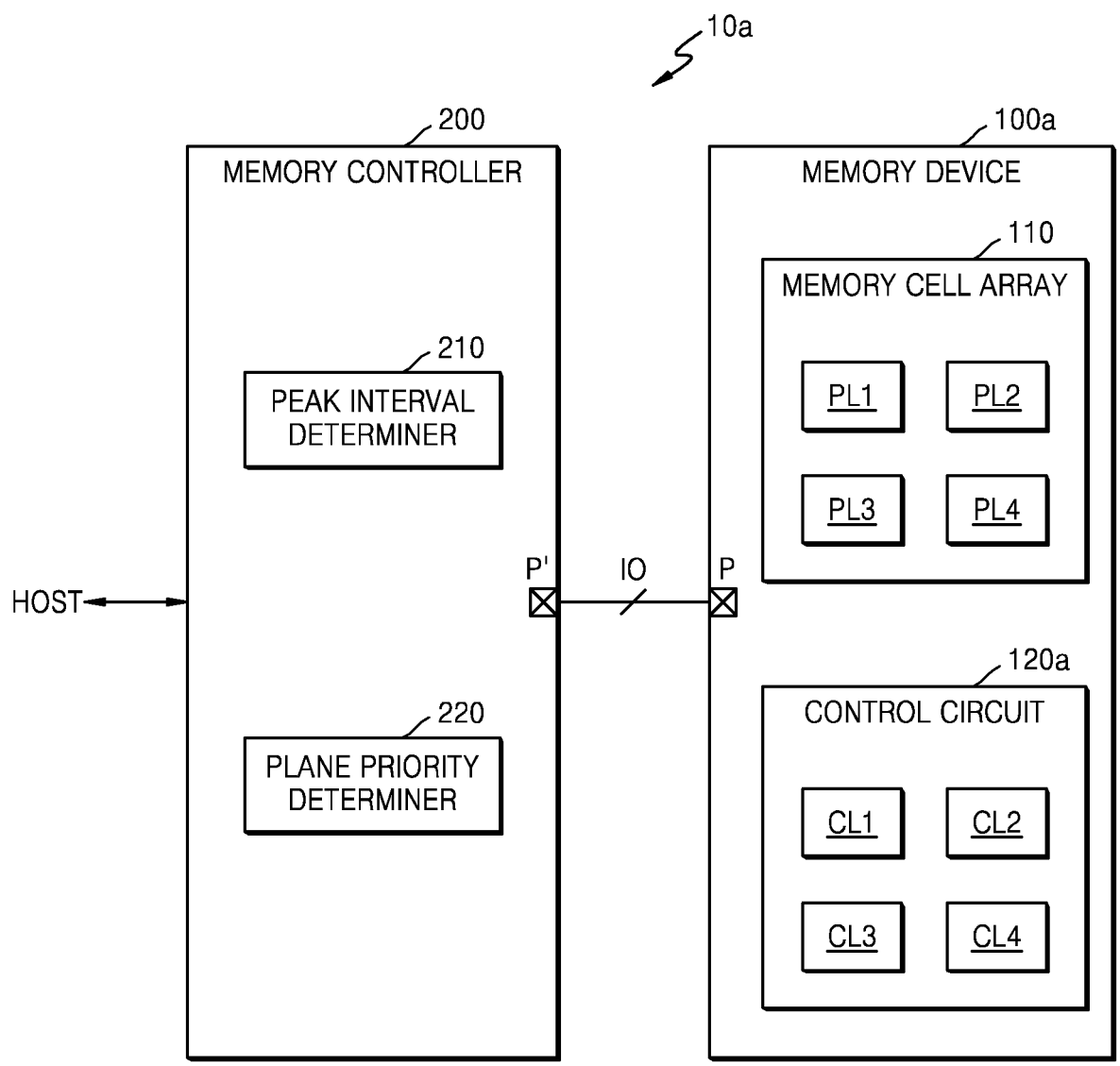
FIG. 9 is a block diagram schematically illustrating a memory system 10a according to some example embodiments.

FIG. 9 is a block diagram schematically illustrating a memory system 10a according to some example embodiments.

Referring to FIG. 9, the memory system 10a may correspond to a modification of the memory system 10 of FIG. 1, and details described above with reference to FIGS. 1 to 8 may be applied to the description of FIG. 9. The memory system 10a may include a memory device 100a and a memory controller 200. The memory device 100a may be a non-volatile memory device and may be implemented as a memory chip. The memory device 100a may include a memory cell array 110 and a control circuit 120a, and the memory cell array 110 and the control circuit 120a may be implemented as a single memory chip. The control circuit 120a according to some example embodiments may be implemented differently from the control circuit 120 of FIG. 1. Hereinafter, therefore, the control circuit 120a will be mainly described.

The control circuit 120a may include first to fourth control logics CL1 to CL4. The first to fourth control logics CL1 to CL4 may respectively correspond to first to fourth memory planes PL1 to PL4 and may respectively control operations of the first to fourth memory planes PL1 to PL4. Hereinafter, detailed operations of the first to fourth control logics CL1 to CL4 will be described in detail with reference to FIG. 10.

Figure 10:
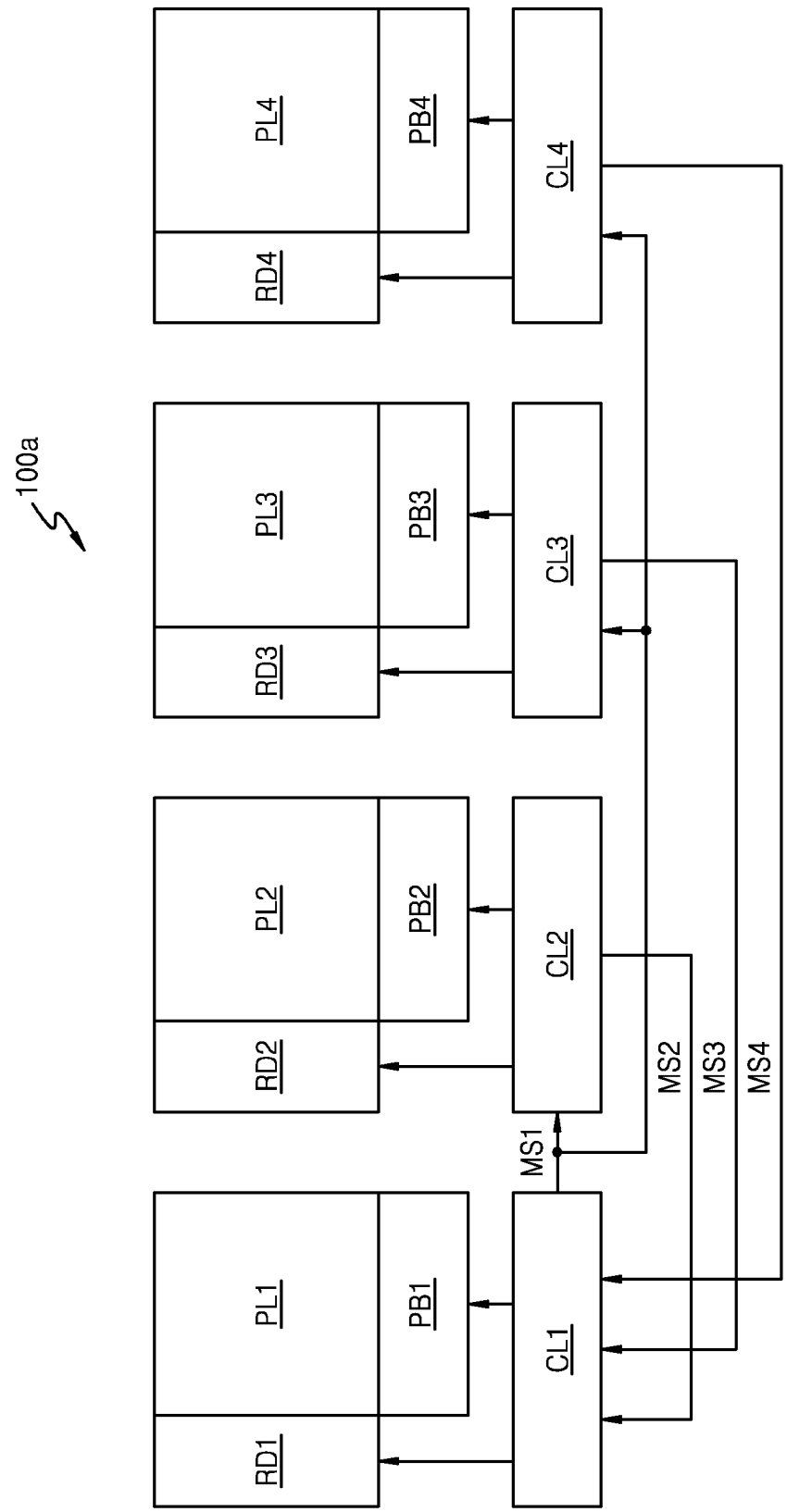
FIG. 10 is a block diagram illustrating a memory device 100a of FIG. 9, according to some example embodiments.

FIG. 10 is a block diagram illustrating the memory device 100a of FIG. 9 according to some example embodiments.

Referring to FIGS. 9 and 10, the memory device 100a may include the memory cell array 110 including the first to fourth memory planes PL1 to PL4, and for example, the memory cell array 110 may be disposed on the first semiconductor layer L1 of FIG. 4. Also, the memory device 100a may further include first to fourth row decoders RD1 to RD4, first to fourth page buffers PB1 to PB4, and the first to fourth control logics CL1 to CL4, and for example, the first to fourth row decoders RD1 to RD4, the first to fourth page buffers PB1 to PB4, and the first to fourth control logics CL1 to CL4 may be disposed on the second semiconductor layer L2 of FIG. 4.

The first control logic CL1 may monitor an operation of the first memory plane PL1 to generate a first monitoring signal MS1 and may provide the generated first monitoring signal MS1 to the second to fourth control logics CL2 to CL4. In some example embodiments, when the first memory plane PL1 enters a peak power interval, the first monitoring signal MS1 may be activated, and for example, may have a logic high level. In some example embodiments, when the first memory plane PL1 does not enter the peak power interval, the first monitoring signal MS1 may be deactivated, and for example, may have a logic low level. For example, the first monitoring signal MS1 may be implemented as a flag.

Likewise, the second control logic CL2 may monitor an operation of the second memory plane PL2 to generate a second monitoring signal MS2 and may provide the generated second monitoring signal MS2 to the first, third, and fourth control logics CL1, CL3, and CL4. The third control logic CL3 may monitor an operation of the third memory plane PL3 to generate a third monitoring signal MS3 and may provide the generated third monitoring signal MS3 to the first, second, and fourth control logics CL1, CL2, and CL4. The fourth control logic CL4 may monitor an operation of the fourth memory plane PL4 to generate a fourth monitoring signal MS4 and may provide the generated fourth monitoring signal MS4 to the first to third control logics CL1 to CL3.

The first control logic CL1 may determine whether the first memory plane PL1 enters the peak power interval, based on the first monitoring signal MS1. When the first memory plane PL1 enters the peak power interval as a result of the determination, the first control logic CL1 may determine whether the second to fourth memory planes PL2 to PL4 enter the peak power interval, based on the second to fourth monitoring signals MS2 to MS4.

When at least one of the second to fourth memory planes PL2 to PL4 enters the peak power interval as a result of the determination, the first control logic CL1 may delay or suspend an operation of the first memory plane PL1. In some example embodiments, when at least one of the activated second to fourth monitoring signals MS2 to MS4 is deactivated, the first control logic CL1 may determine that at least one of the second to fourth memory planes PL2 to PL4 deviates from the peak power interval, and may resume the operation of the first memory plane PL1. In some example embodiments, when a determined time elapses from a time when the operation of the first memory plane PL1 suspends, the first control logic CL may resume the operation of the first memory plane PL1.

Figure 11:
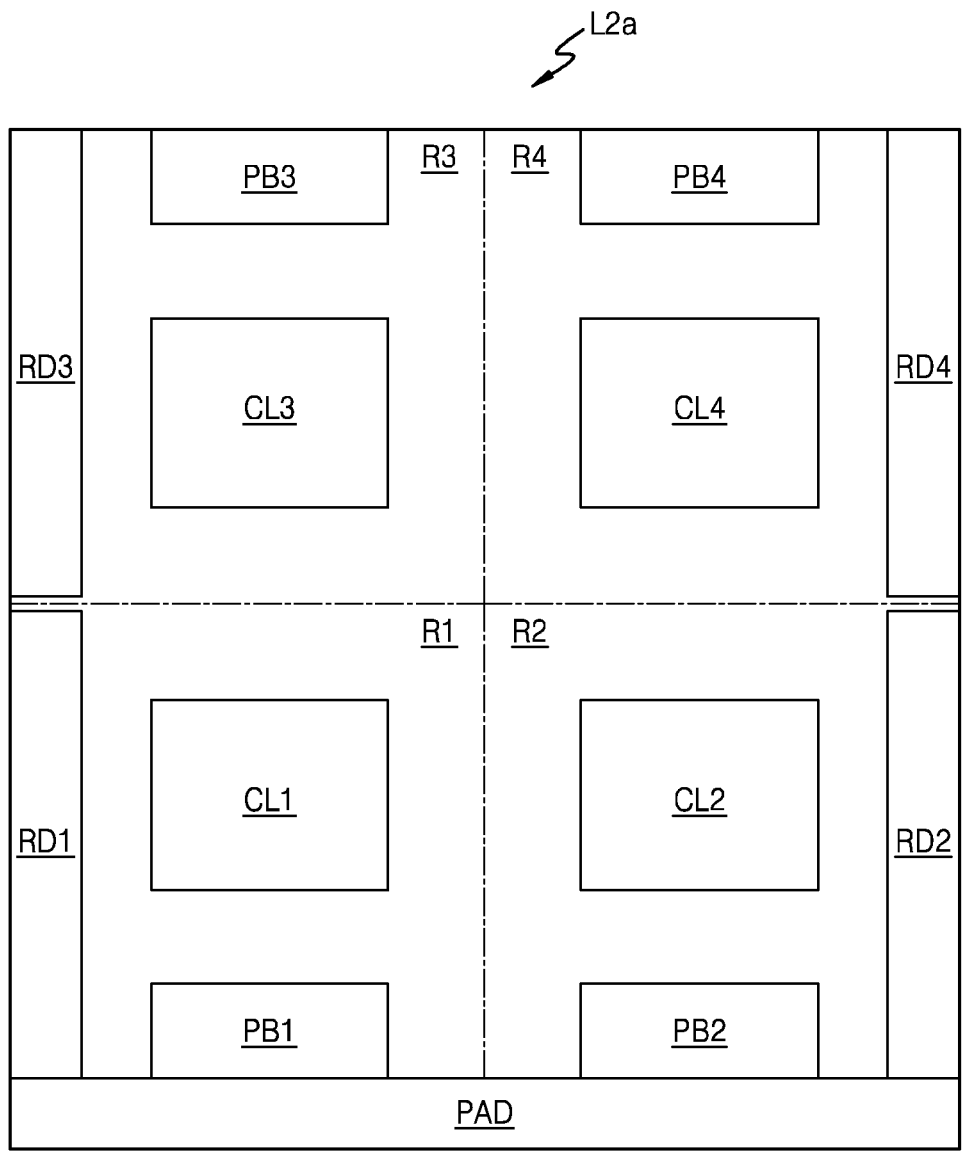
FIG. 11 is a plan view illustrating an upper surface of an example of a second semiconductor layer L2a of FIG. 4, according to some example embodiments.
Figure 11:
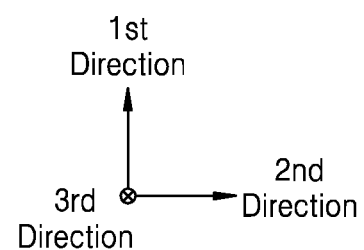

FIG. 11 is a plan view illustrating an upper surface of an example L2a of the second semiconductor layer of FIG. 4 according to some example embodiments.

Referring to FIGS. 4, 9, 10, and 11, a second semiconductor layer L2a may include a pad region PAD and a peripheral circuit region, and the peripheral circuit region may include first to fourth regions R1 to R4. A plurality of I/O pads P may be provided in the pad region PAD, and the plurality of I/O pads P may be connected to the first to fourth regions R1 to R4 through metal wirings on the second semiconductor layer L2. A first memory plane PL1 may be disposed in an upper portion of the first region R1, a second memory plane PL2 may be disposed in an upper portion of the second region R2, a third memory plane PL3 may be disposed in an upper portion of the third region R3, and a fourth memory plane PL4 may be disposed in an upper portion of the fourth region R4.

A first row decoder RD1, a first page buffer PB1, and a first control logic CL1 may be disposed in the first region R1. A second row decoder RD2, a second page buffer PB2, and a second control logic CL2 may be disposed in the second region R2. A third row decoder RD3, a third page buffer PB3, and a third control logic CL3 may be disposed in the third region R3. A fourth row decoder RD4, a fourth page buffer PB4, and a fourth control logic CL4 may be disposed in the fourth region R4. In FIG. 11, it is illustrated that one row decoder and one page buffer are disposed in each of the first to fourth regions R1 to R4, but some example embodiments are not limited thereto. In some example embodiments, a plurality of row decoders and a plurality of page buffers may be disposed in each of the first to fourth regions R1 to R4. Also, according to some example embodiments, disposition of a row decoder, a page buffer, and a control logic in each of the first to fourth regions R1 to R4 may be variously changed.

The first control logic CL1 may be connected to the second to fourth control logics CL2 to CL4, may receive second to fourth monitoring signals MS2 to MS4 from the second to fourth control logics CL2 to CL4, and may provide a first monitoring signal MS1 to the second to fourth control logics CL2 to CL4. The first control logic CL1 may be connected to the first row decoder RD1 and the first page buffer PB1. Therefore, the first control logic CL1 may monitor the operations of the first to fourth memory planes PL1 to PL4, and based on a result of the monitoring, the first control logic CL1 may control an operation of the first memory plane PL1 so that peak power intervals of the first to fourth memory planes PL1 to PL4 are at least partially distributed.

Figure 12A:
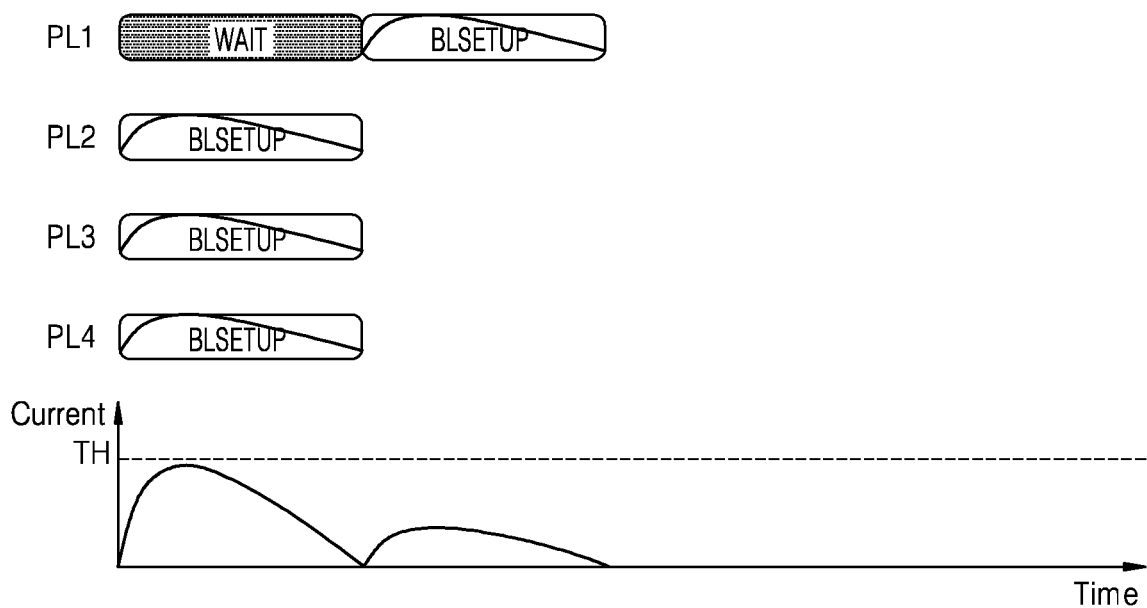
FIGS. 12A and 12B illustrate a peak control operation of a memory device of FIG. 9, according to some example embodiments.
Figure 12B:
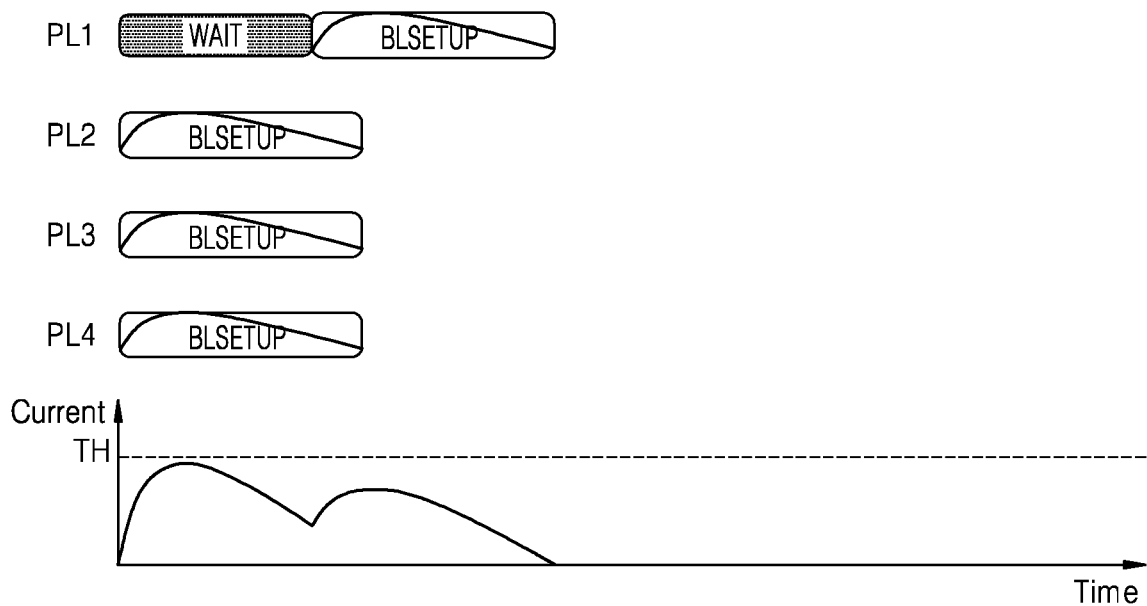

FIGS. 12A and 12B illustrate a peak control operation of the memory device 100a of FIG. 9 according to some example embodiments.

Referring to FIG. 12A, the first control logic CL1 may determine that all of the operations of the first to fourth memory planes PL1 to PL4 correspond to the peak power interval, based on the first to fourth monitoring signal MS1 to MS4. For example, all of the operations of the first to fourth memory planes PL1 to PL4 may correspond to a bit line setup interval BLSETUP. The first control logic CL1 may suspend a bit line setup operation of the first memory plane PL1 in order for bit line setup intervals BLSETUP of the first to fourth memory planes PL1 to PL4 not to overlap one another.

For example, the first control logic CL1 may suspend the bit line setup operation on the first memory plane PL1 until the bit line setup intervals BLSETUP of the second to fourth memory planes PL2 to PL4 end. The first control logic CL1 may adaptively determine a time when the bit line setup operation on the first memory plane PL1 resumes, based on the upper power limit of the PMIC. In some example embodiments, when all of the bit line setup intervals BLSETUP of the second to fourth memory planes PL2 to PL4 end, the first control logic CL1 may resume the bit line setup operation on the first memory plane PL1. In some example embodiments, when the bit line setup interval BLSETUP of at least one of the second to fourth memory planes PL2 to PL4 ends, the first control logic CL1 may resume the bit line setup operation on the first memory plane PL1.

Referring to FIG. 12B, the first control logic CL1 may suspend the bit line setup operation of the first memory plane PL1 so that the bit line setup intervals BLSETUP of the first to fourth memory planes PL1 to PL4 do not completely overlap one another. As described above with reference to FIG. 2A, the amount of current used for the operation of each of the first to fourth memory planes PL1 to PL4 may have a peak value at an initial stage of the bit line setup interval BLSETUP. Therefore, the first control logic CL1 may suspend the bit line setup operation of the first memory plane PL1 so that initial intervals of the bit line setup intervals BLSETUP of the first to fourth memory planes PL1 to PL4 do not overlap one another. For example, the first control logic CL1 may suspend the bit line setup operation on the first memory plane PL1 during a certain time interval.

Figure 13:
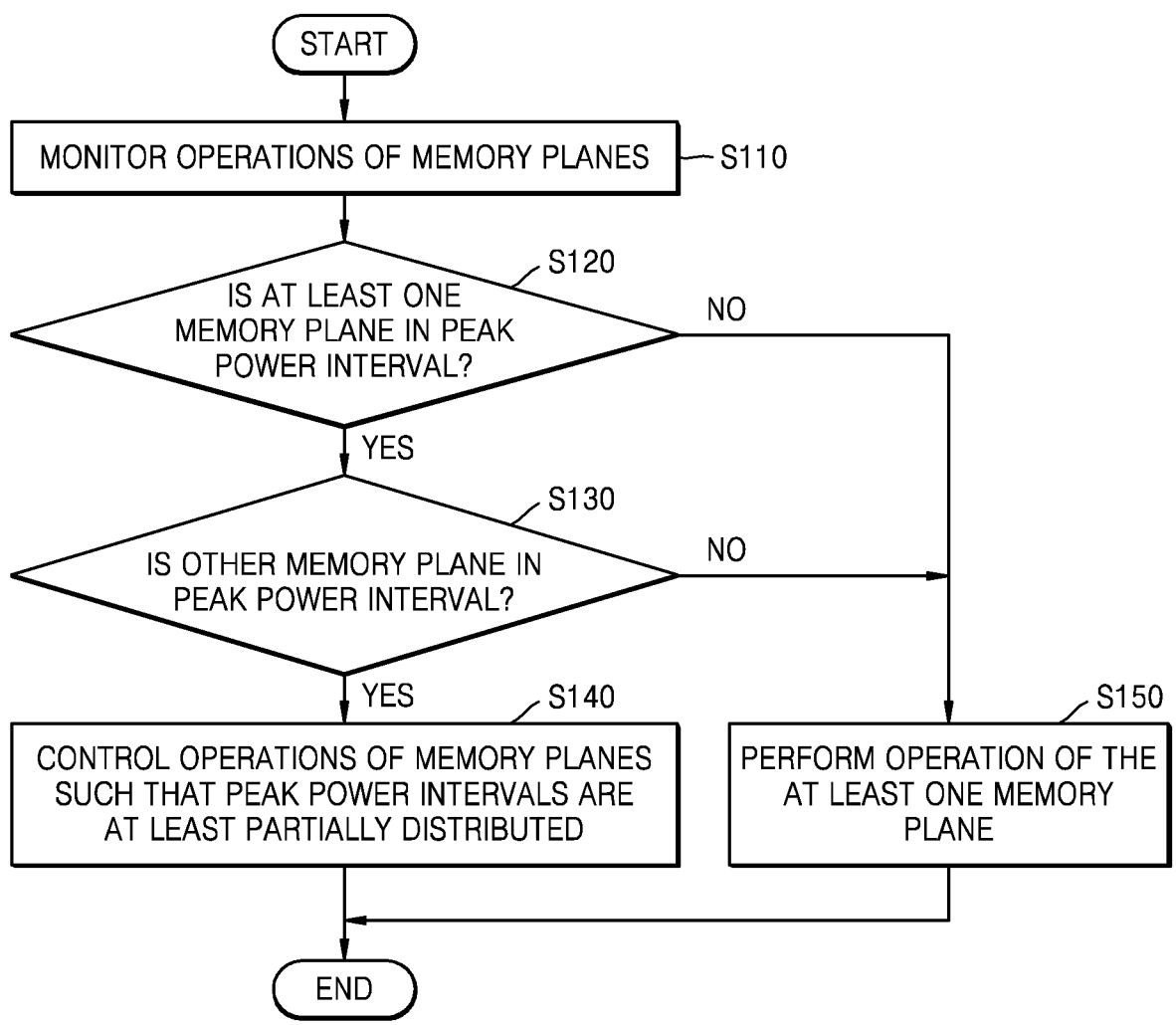
FIG. 13 is a flowchart illustrating an operating method of a memory device, according to some example embodiments.

FIG. 13 is a flowchart illustrating an operating method of a memory device according to some example embodiments.

Referring to FIG. 13, an operation of the memory device may correspond to an operation of controlling a peak power or a peak current of each of a plurality of memory planes included in a single memory chip, and for example, may be performed by the memory device 100 of FIG. 1 or the memory device 100a of FIG. 9. Details described above with reference to FIGS. 1 to 12B may be applied to the description of FIG. 13, and repetitive descriptions are omitted.

In operation S110, operations of the plurality of memory planes may be monitored. In some example embodiments, the monitoring logic 121 of the control circuit 120 may monitor the operations of the plurality of memory planes to generate a monitoring signal MS. In some example embodiments, the first to fourth control logics CL1 to CL4 may monitor operations of corresponding memory planes to generate the first to fourth monitoring signals MS1 to MS4, respectively.

In operation S120, whether at least one memory plane corresponds to the peak power interval may be determined. In some example embodiments, the monitoring logic 121 of the control circuit 120 may determine whether at least one of the plurality of memory planes enters the peak power interval. When the at least one memory plane corresponds to the peak power interval as a result of the determination, operation S130 may be performed, and otherwise, operation S150 may be performed.

In operation S130, whether another memory plane corresponds to the peak power interval may be determined. In some example embodiments, the monitoring logic 121 of the control circuit 120 may determine whether at least one other memory plane of the plurality of memory planes enters the peak power interval. When the other memory plane corresponds to the peak power interval as a result of the determination, operation S140 may be performed, and otherwise, operation S150 may be performed.

In some example embodiments, between operations S120 and S130, the operating method may further include an operation of determining the other memory plane, based on priority information between the plurality of memory planes. In detail, the monitoring logic 121 may determine whether a memory plane, having priority higher than that of the memory plane which is determined as corresponding to the peak power interval in operation S120, corresponds to the peak power interval.

In operation S140, operations of the plurality of memory planes may be controlled so that the peak power intervals are at least partially distributed. In some example embodiments, the peak control logic 122 of the control circuit 120 may suspend operations of some memory planes so that the peak power intervals do not completely overlap each other. In some example embodiments, the peak control logic 122 of the control circuit 120 may suspend operations of some memory planes so that initial intervals of the peak power intervals do not overlap each other. In operation S150, an operation may be performed on at least one memory plane. In some example embodiments, the peak control logic 122 of the control circuit 120 may control a row decoder and a page buffer in order for an operation of at least one memory plane to be normally performed.

Figure 14:
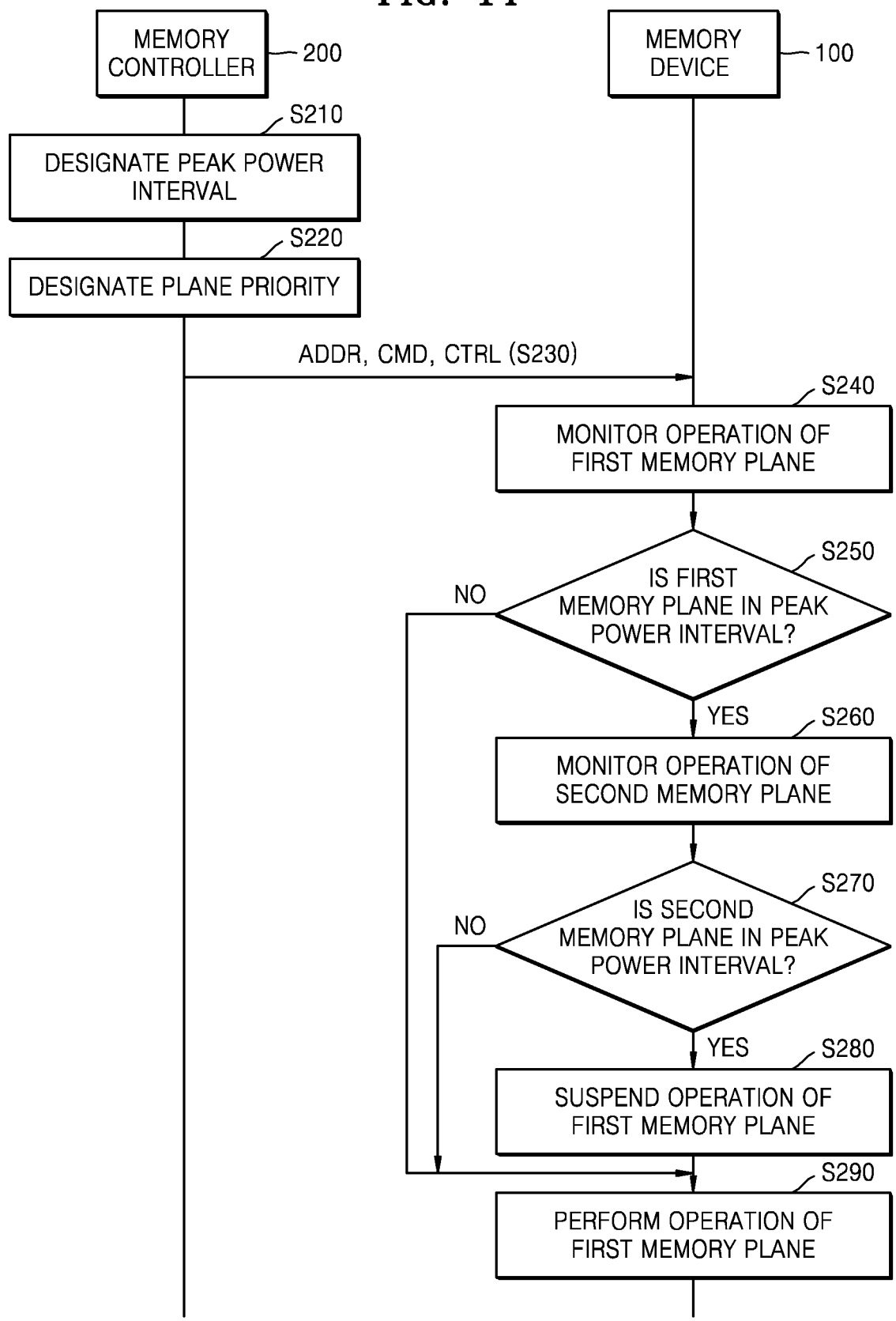
FIG. 14 is a flowchart illustrating an operation between a memory controller and a memory device, according to some example embodiments.

FIG. 14 is a flowchart illustrating an operation between the memory controller 200 and the memory device 100 according to some example embodiments.

Referring to FIG. 14, the illustrated operation may correspond to an implementation example of the operating method of FIG. 13, and details described above with reference to FIGS. 1 to 13 may be applied to the description of FIG. 14. Thus, repetitive descriptions are omitted. In FIG. 14, a memory device is illustrated as corresponding to the memory device 100 of FIG. 1, but the some example embodiments are not limited thereto. In some example embodiments, the memory device of FIG. 14 may correspond to the memory device 100a of FIG. 9.

In operation S210, the memory controller 200 may designate the peak power interval. For example, the peak interval determiner 210 of the memory controller 200 may designate a peak power interval, a peak current interval, or a peak control interval. For example, the peak power interval may include at least one of a bit line setup interval for a program operation, a bit line precharge interval for a read operation, and a latch initialization interval before the program operation or the read operation.

In operation S220, the memory controller 200 may designate priorities between a plurality of memory planes. For example, a plane priority determiner 220 of the memory controller 200 may determine the priorities between the plurality of memory planes. In some example embodiments, operations S210 and S220 may be substantially contemporaneously performed. In some example embodiments, operation S220 may be first performed, and then, operation S210 may be performed.

In some example embodiments, information about the peak power interval and plane priority information may be determined in a process of releasing the memory device 100 and may be programmed in the memory cell array 110 of the memory device 100. When power is applied to the memory system 10, namely, after booting, the memory controller 200 may read, through IDR, the information about the peak power interval and the plane priority information which are programmed in the memory cell array 110.

In operation S230, the memory controller 200 may transmit an address ADDR, a command CMD, and a control signal CTRL to the memory device 100. In some example embodiments, the memory controller 200 may further transmit data to the memory device 100 so as to perform the program operation. In some example embodiments, the memory controller 200 may transmit the information about the peak power interval and the plane priority information to the memory device 100 by using a set feature command.

In operation S240, the memory device 100 may monitor an operation of the first memory plane PL1. For example, the monitoring logic 121 of FIG. 1 or the first control logic CL1 of FIG. 9 may determine whether the operation of the first memory plane PL1 corresponds to the peak power interval and may generate a monitoring signal, based on a result of the determination. In operation S250, the memory device 100 may determine whether the first memory plane PL1 corresponds to the peak power interval. When the first memory plane PL1 corresponds to the peak power interval as a result of the determination, operation S260 may be performed, and otherwise, operation S290 may be performed.

In operation S260, the memory device 100 may monitor an operation of the second memory plane PL2. For example, the monitoring logic 121 of FIG. 1 or the second control logic CL2 of FIG. 9 may determine whether the operation of the second memory plane PL2 corresponds to the peak power interval and may generate a monitoring signal, based on a result of the determination. In operation S270, the memory device 100 may determine whether the second memory plane PL2 corresponds to the peak power interval. When the second memory plane PL2 corresponds to the peak power interval as a result of the determination, operation S280 may be performed, and otherwise, operation S290 may be performed.

In operation S280, the memory device 100 may suspend the operation of the first memory plane PL1. For example, the peak control logic 122 of FIG. 1 or the first control logic CL1 of FIG. 9 may suspend the operation of the first memory plane PL1 for a certain time. In operation S290, the memory device 100 may perform an operation of the first memory plane PL1. For example, the peak control logic 122 of FIG. 1 or the first control logic CL1 of FIG. 9 may allow the operation of the first memory plane PL1 to be performed. Also, when a certain time elapses after operation S280, the peak control logic 122 of FIG. 1 or the first control logic CL1 of FIG. 9 may resume the operation of the first memory plane PL1.

Figure 15:
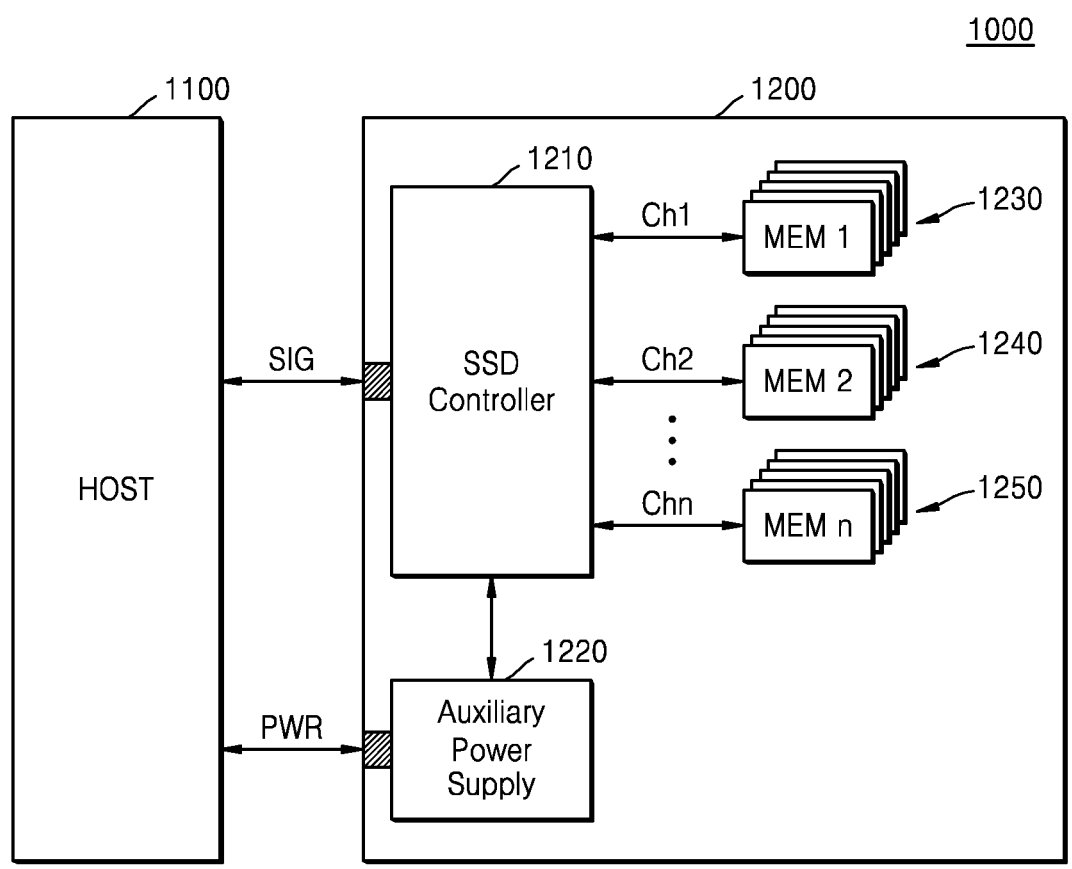
FIG. 15 is a block diagram illustrating an example where a memory device according to some example embodiments are applied to a solid state drive (SSD) system.

FIG. 15 is a block diagram illustrating an example where the memory device according to some example embodiments is applied to an SSD system 1000.

Referring to FIG. 15, the SSD system 1000 may include a host 1100 and an SSD 1200. The SSD 1200 may transmit or receive a signal to or from the host 1100 through a signal connector SIG and may be supplied with power through a power connector PWR. The SSD 1200 may include an SSD controller 1210, an auxiliary power supply 1220, and a plurality of memory devices 1230, 1240, and 1250. The memory devices 1230, 1240, and 1250 may each be a vertically stacked NAND flash memory. In this case, the SSD 1200 may be implemented by using some example embodiments described above with reference to FIGS. 1 to 14.

While some example embodiments been particularly shown and described, it will be understood that various changes in form and details may be made therein without departing from the spirit and scope of the following claims.

What is claimed is:

1. A non-volatile memory device, comprising:
   a memory chip, including
      a first semiconductor layer including a memory cell array, the memory cell array including a plurality of memory planes sharing a pad, the pad configured to communicate input and output signals, and
      a second semiconductor layer including a control circuit configured to
         monitor operations of the plurality of memory planes to obtain a monitoring result, and
         control an operation of at least one of the plurality of memory planes based on the monitoring result such that a plurality of peak power intervals of the plurality of memory planes are at least partially distributed,
      wherein the first semiconductor layer is above the second semiconductor layer, and the memory chip has a cell over periphery (COP).

2. The non-volatile memory device of claim 1, wherein the control circuit is further configured to:
   delay the operation of the at least one of the plurality of memory planes when the plurality of peak power intervals of at least some of the plurality of memory planes overlap each other.

3. The non-volatile memory device of claim 1, wherein the control circuit is further configured to:
   monitor whether an operation of each of the plurality of memory planes enters a corresponding peak power interval among the plurality of peak power intervals, and
   generate a monitoring signal based on a result of the monitoring.

4. The non-volatile memory device of claim 1, wherein the plurality of peak power intervals correspond to at least one of a bit line setup interval for a program operation, a bit line precharge interval for a read operation, or a latch initialization interval before a program operation or a read operation.

5. The non-volatile memory device of claim 1, wherein the control circuit includes a plurality of control logics, each of the plurality of control logics corresponding to a respective memory plane of the plurality of memory planes, and
   each of the plurality of control logics is configured to
      monitor whether an operation of the respective memory plane enters a peak power interval among the plurality of peak power intervals to obtain a respective monitoring result,
      generate a respective monitoring signal based on the respective monitoring result, and
      provide the respective monitoring signal to other control logics of the plurality of control logics.

6. The non-volatile memory device of claim 5, wherein each of the plurality of control logics is further configured to:
   determine a priority of each the plurality of memory planes using priority information; and
   control the operation of the at least one of the plurality of memory planes based on a monitoring signal associated with another memory plane among the plurality of memory planes having a higher priority than the at least one of the plurality of memory planes.

7. The non-volatile memory device of claim 6, wherein information about the plurality of peak power intervals or the priority information is obtained based on a set feature command received from a memory controller.

8. The non-volatile memory device of claim 5, wherein the plurality of memory planes includes a first memory plane and a second memory plane,
   the plurality of control logics includes
      a first control logic configured to
         generate a first monitoring signal corresponding to the first memory plane, and control an operation of the first memory plane based on a second monitoring signal when the operation of the first memory plane enters a peak power interval among the plurality of peak power intervals, and a second control logic configured to generate the second monitoring signal corresponding to the second memory plane.

9. The non-volatile memory device of claim 8, wherein the first control logic is further configured to:

delay the operation of the first memory plane when an operation of the second memory plane is in a corresponding peak power interval among the plurality of peak power intervals, and allow the operation of the first memory plane to be performed when the operation of the second memory plane is outside the corresponding peak power interval.

10. The non-volatile memory device of claim 9, wherein the first control logic is further configured to:

delay the operation of the first memory plane until the second monitoring signal is changed.

11. The non-volatile memory device of claim 9, wherein the first control logic is further configured to:

delay the operation of the first memory plane for a certain time.

12. A non-volatile memory device, comprising:

a memory chip, including a memory cell array including a plurality of memory planes sharing a pad, the pad configured to communicate input and output signals, and a control circuit configured to control an operation of at least one of the plurality of memory planes such that a plurality of peak power intervals of the plurality of memory planes are at least partially distributed, the control circuit including a plurality of control logics, each of the plurality of control logics corresponding to a respective memory plane of the plurality of memory planes, the plurality of memory planes includes a first memory plane and a second memory plane, the plurality of control logics includes:

a first control logic configured to generate a first monitoring signal corresponding to the first memory plane, and control an operation of the first memory plane based on a second monitoring signal when the operation of the first memory plane enters a peak power interval among the plurality of peak power intervals, and a second control logic configured to generate the second monitoring signal corresponding to the second memory plane.

13. The non-volatile memory device of claim 12, wherein the control circuit is further configured to delay an operation of the at least one of the plurality of memory planes to distribute the plurality of peak power intervals when the plurality of peak power intervals of the plurality of memory planes overlap each other, the memory cell array is above the control circuit, and
the memory chip has a cell over periphery (COP) structure.

14. The non-volatile memory device of claim 12, wherein the at least one of the plurality of memory planes is determined based on priority information of each of the plurality of memory planes.

15. An operating method performed by a control circuit of a non-volatile memory device including a memory chip, the operating method comprising:

monitoring operations of a plurality of memory planes included in the memory chip;

determining whether an operation of at least one of the plurality of memory planes corresponds to a peak power interval;

determining whether an operation of another memory plane of the plurality of memory planes corresponds to the peak power interval when the operation of the at least one of the plurality of memory planes corresponds to the peak power interval; and controlling the operations of the plurality of memory planes such that a plurality of peak power intervals including the peak power interval are at least partially distributed when the operation of the other memory plane corresponds to the peak power interval, the controlling being based on priority information of each of the plurality of memory planes.

16. The operating method of claim 15, further comprising:

determining the other memory plane using the priority information before the determining of whether the operation of the other memory plane corresponds to the peak power interval.

17. The operating method of claim 16, further comprising:

receiving the priority information or information about the peak power interval from a memory controller before the monitoring.

18. The operating method of claim 15, wherein the controlling includes performing the operation of the at least one of the plurality of memory planes when the operation of the at least one of the plurality of memory planes does not correspond to the peak power interval or the operation of the other memory plane does not correspond to the peak power interval.

19. The operating method of claim 15, wherein the controlling includes suspending the operation of the at least one of the plurality of memory planes until the operation of the other memory plane deviates from the peak power interval.

20. The operating method of claim 15, wherein the controlling includes suspending the operation of the at least one of the plurality of memory planes during a certain time.

* * * * *